United States Patent [19]

Mickelsen et al.

[11] E Patent Number: Re. 31,968

[45] Reissued Date of Patent: Aug. 13, 1985

[54] METHODS FOR FORMING THIN-FILM HETEROJUNCTION SOLAR CELLS FROM I-III-$VI_2$ CHALCOPYRITE COMPOUNDS, AND SOLAR CELLS PRODUCED THEREBY

[75] Inventors: Reid A. Mickelsen, Bellevue; Wen S. Chen, Seattle, both of Wash.

[73] Assignee: The Boeing Company, Seattle, Wash.

[21] Appl. No.: 620,637

[22] Filed: Jun. 14, 1984

Related U.S. Patent Documents

Reissue of:

[64] Patent No.: 4,335,266
Issued: Jun. 15, 1982
Appl. No.: 221,761
Filed: Dec. 31, 1980

[51] Int. Cl.[3] ..... H01L 31/06; H01L 31/18

[52] U.S. Cl. ..... 136/260; 136/264; 136/265; 427/76; 427/255.2; 148/174; 148/178; 357/16; 357/30

[58] Field of Search ..... 136/252, 255, 258 PC, 136/260, 264, 265; 427/74, 76, 87, 255.2; 148/174, 178; 357/16, 30; 29/572

[56] References Cited

U.S. PATENT DOCUMENTS

| | | | |
|---|---|---|---|
| 3,110,620 | 11/1963 | Bertelsen | 427/99 |
| 3,186,874 | 6/1965 | Gorski | 136/255 |
| 3,316,386 | 4/1967 | Yaffe et al. | 219/272 |
| 3,436,625 | 4/1969 | Newman | 357/61 |
| 3,446,936 | 5/1969 | Hanson et al. | 219/271 |
| 3,447,234 | 6/1969 | Reynolds et al. | 29/572 |
| 3,449,092 | 6/1969 | Hammond | 428/635 |
| 3,508,126 | 4/1970 | Newman et al. | 357/16 |
| 3,531,335 | 9/1970 | Heyerdahl | 148/174 |
| 3,565,686 | 2/1971 | Babcock et al. | 427/76 |
| 3,612,859 | 10/1971 | Schumacher | 250/43.5 D |
| 3,636,916 | 1/1972 | Thelen | 118/8 |
| 3,647,197 | 3/1972 | Holloway | 263/47 R |
| 3,654,109 | 4/1972 | Hohl | 204/192 |
| 3,716,406 | 2/1973 | Scholl et al. | 427/74 |
| 3,716,424 | 2/1973 | Schoolar | 148/175 |
| 3,793,070 | 2/1974 | Schoolar | 156/606 |
| 3,914,856 | 10/1975 | Fang | 29/572 |

(List continued on next page.)

FOREIGN PATENT DOCUMENTS

| | | | |
|---|---|---|---|
| 54-140887 | 11/1979 | Japan | 136/265 |

OTHER PUBLICATIONS

R. D. Tomlinson et al., "Some Observations on the Effect of Evaporation Source Temperature on the Composition of $CuInSe_2$ Thin Films", *Thin Solid Films*, vol. 64, pp. L3–L6 (1979).

*Primary Examiner*—Aaron Weisstuch
*Attorney, Agent, or Firm*—Hughes, Barnard & Cassidy (List continued on next page.)

[57] ABSTRACT

An improved thin-film, large area solar cell, and methods for forming the same, having a relatively high light-to-electrical energy conversion efficiency and characterized in that the cell comprises a p-n type heterojunction formed of: (i) a first semiconductor layer comprising a photovoltaic active material selected from the class of I-III-$VI_2$ chalcopyrite ternary materials which is vacuum deposited in a thin "composition-graded" layer ranging from on the order ot about 2.5 microns to about 5.0 microns ($\cong$2.5 $\mu$m to $\cong$5.0 $\mu$m) and wherein the lower region of the photovoltaic active material preferably comprises a low resistivity region of p-type semiconductor material having a superimposed region of relatively high resistivity, transient n-type semiconductor material defining a transient p-n homojunction; and (ii), a second semiconductor layer comprising a low resistivity n-type semiconductor material; wherein interdiffusion (a) between the elemental constituents of the two discrete juxtaposed regions of the first semiconductor layer defining a transient p-n homojunction layer, and (b) between the transient n-type material in the first semiconductor layer and the second n-type semiconductor layer, causes the transient n-type material in the first semiconductor layer to evolve into p-type material, thereby defining a thin layer heterojunction device characterized by the absence of voids, vacancies and nodules which tend to reduce the energy conversion efficiency of the system.

147 Claims, 16 Drawing Figures

U.S. PATENT DOCUMENTS

| | | | |
|---|---|---|---|
| 3,978,510 | 8/1976 | Kasper et al. | 357/30 |
| 4,004,342 | 1/1977 | Park et al. | 29/590 |
| 4,024,376 | 5/1977 | Redel | 219/272 |
| 4,036,167 | 7/1977 | Lu | 118/7 |
| 4,046,565 | 9/1977 | Miller | 430/57 |
| 4,059,067 | 11/1977 | Lardon et al. | 118/7 |
| 4,063,974 | 12/1977 | Fraas | 148/175 |
| 4,086,101 | 4/1978 | Jordan et al. | 136/258 |
| 4,101,341 | 7/1978 | Selders | 136/258 |
| 4,251,287 | 2/1981 | Dalal | 136/258 |
| 4,313,254 | 2/1982 | Feldman | 22/572 |

OTHER PUBLICATIONS

Kazmerski, *The Utilization of I-II-VI$_2$ Ternary Compound Semiconductors In Thin-Film Heterojunction and Homojunction Photovoltaic Devices,* Inst. Phys. Conf. Ser. No. 35, pp. 217-228 (1977).

Don et al., *Copper Indium Diselenide For CdS: CuInSe$_2$ Solar Cells,* European Community Photovoltaic Solar Energy Conference, Cannes, France, pp. 879-901 (Oct. 1980).

L. Kazmerski et al., "Auger Analysis of CdS-CuInSe$_2$ Thin-Film Solar Cells", *IEEE Trans. Electron Devices,* vol. Ed-24, pp. 496-498 (1977).

H. Neumann et al., "Structural and Electrical Properties of CuInSe$_2$ Epitaxial Layers Prepared by Single Source Evaporation", *Thin Solid Films,* vol. 74, pp. 197-204 (1980).

R. Durny et al., "Preparative of Amorphous CuInSe$_2$ Thin Films", *Thin Solid Films,* vol. 69, pp. L11-L13 (1980).

L. Kazmerski et al., "CuInS$_2$ Thin-Film Homojunction Solar Cells", *J. Appl. Phys.,* vol. 48, pp. 3178-3180 (1977).

L. Kazmerski et al., "The Performance of Copper-Ternary Based Thin-Film Solar Cells", Conf. Record, 13th IEEE Photovohaic Specialists Conf. (1978), pp. 184-189.

L. Kazmerski et al., "Fabrication and Characterization of ITO/CuInSe$_2$ Photovoltaic Heterojunctions", *Conf. Record, 13th IEEE Photovoltaic Specialists Conf.* (1978), pp. 541-544.

F. R. White et al., "Growth of CuInSe$_2$ on CdS Using Molecular Beam Epitaxy", *J. Appl. Phys.,* vol. 50, pp. 544-545 (1979).

A. R. Tebo, "Solar Cells", *Electro-Optical Systems Design,* May 1980, pp. 39-49.

R. A. Mickelsen et al., "High Photocurrent Polycrystalline Thin-Film CdS/CuInSe$_2$ Solar Cell", *Appl. Phys. Lett.,* vol. 36, pp. 371-373 (Mar. 1980).

W. S. Chen et al., "Thin-Film CdS/CuInSe$_2$ Heterojunction Solar Cell", *Proc. 24th Annual Photooptical Eng. Symposium* (1980).

R. A. Mickelsen et al., "Development of A 9.4% Efficient Thin-Film CuInSe$_2$/CdS Solar Cell", IEEE Photovoltaic Specialists Conf. (1981).

J. L. Shay et al., "Efficient CuInSe$_2$/CdS Solar Cells", *Appl. Phys. Lett.,* vol. 27, pp. 89-90 (1975).

B. Tell et al., "Motion of p-n Junctions in CuInSe$_2$", *Appl. Phys. Lett.,* vol. 28, pp. 454-455 (1976).

B. Tell et al., "Photovoltaic Properties and Junction Formation in CuInSe$_2$", *J. Appl. Phys.,* vol. 48, pp. 2477-2480 (1977).

B. Tell et al., "Photovoltaic Properties of p-n Junctions in CuInS$_2$", *J. Appl. Phys.,* vol. 50, pp. 5045-5046 (1979).

F. R. White et al., "Growth of CuInSe$_2$ Films Using Molecular Beam Epitaxy", *J. Vac. Sci. Technol.,* vol. 16, pp. 287-289 (1979).

S. Wagner et al., "Multicomponent Tetrahedral Compounds for Solar Cells", *J. Crystal Growth,* vol. 39, pp. 151-159 (1977).

S. Wagner et al., "CuInSe$_2$/CdS Heterojunction Photovoltaic Detectors", *Appl. Phys. Lett.,* vol. 25, pp. 434-435 (1974).

J. L. Shay et al., "Preparation and Properties of InP/CdS and CuInSe$_2$/CdS Solar Cells", *Conf. Record, 11th IEEE Photovoltaic Specialists Conf.* (1975), pp. 503-507.

S. Wagner et al., "p-InP/n-CdS Solar Cells and Photovoltaic Detectors", *Appl. Phys. Lett.,* vol. 26, pp. 229-230 (1975).

L. Kazmerski et al., "Ternary Compound Thin Film Solar Cells", Final Report NSF/RANN/SE/AER 75-19576/PR75/4 Oct. 1976.

L. Kazmerski et al., "Thin-Film CuInSe$_2$/CdS Heterojunction Solar Cells", *Appl. Phys. Lett.,* vol. 29, pp. 268-270 (1976).

L. Kazmerski et al., "Growth and Characterization of Thin-Film Compound Semiconductor Photovoltaic Heterojunctions", *J. Vac. Sci. Technol.,* vol. 14, pp. 65-68 (1977).

L. Kazmerski et al., "Auger Electron Spectroscopy Studies of I-III-VI$_2$ Chalcopyrite Compounds", *J. Vac. Sci Technol.,* vol. 15, pp. 249-253 (1978).

A. H. Clark, "Molecular Beam Epitaxy Research on CuInSe$_2$", *Proc. SERI Review Meeting* (Oct. 1978), pp. 385-392.

Y. Kokubun et al., "Photovoltaic Effect in CuInSe$_2$/CdS Heterojunctions", *Japan J. Appl. Phys.,* vol 16, pp. 879-880 (1977).

M. S. Tomar et al., "ZnCdS/CuInSe$_2$ & CdS/ZnIn$_2$Se$_4$ Thin Film Solar Cells", *International Electron Device Meeting,* Wash. D.C. (1978).

D. Fleming, "Cadmium Sulfide/Copper Ternary Heterojunction Cell Research", *SERI Review Meeting Proc.* (1978), pp. 393-420.

J. Piekoszewski et al., "RF Sputtered CuInSe$_2$ Thin Films", Conf. Record, 14th IEEE Photovoltaic Specialists Conf. (1980), pp. 980-985.

K. W. Mitchell, "Evaluation of the CdS/CdTe Heterojunction Solar Cell", Garland Pub. Co., New York (1979), pp. 36-42.

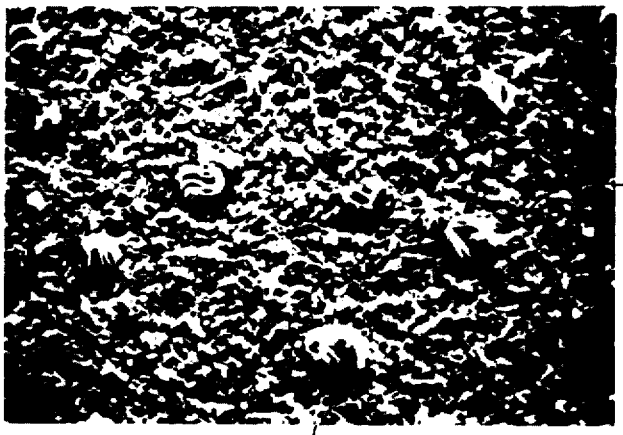
FIG. 7
FIG. 9
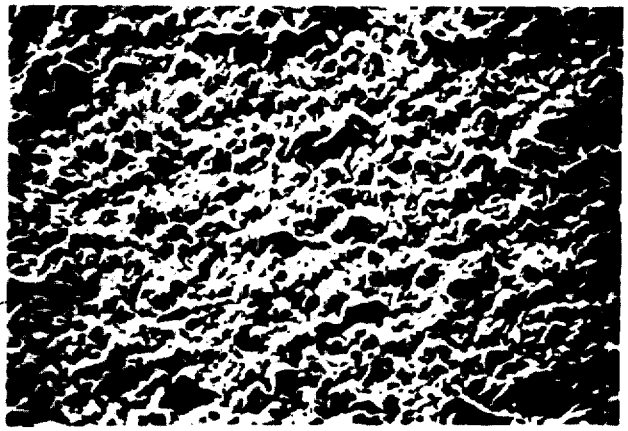
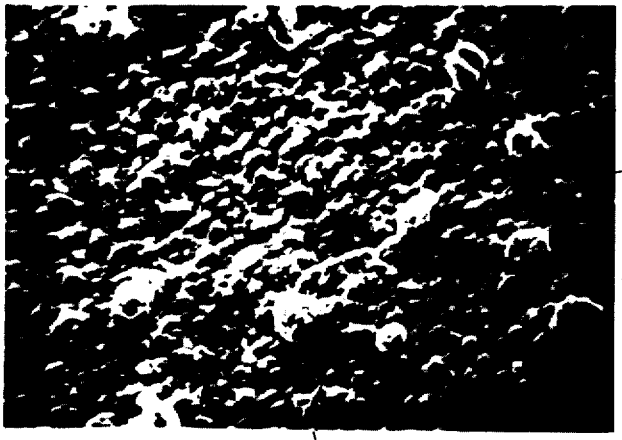
FIG. 8
FIG. 10
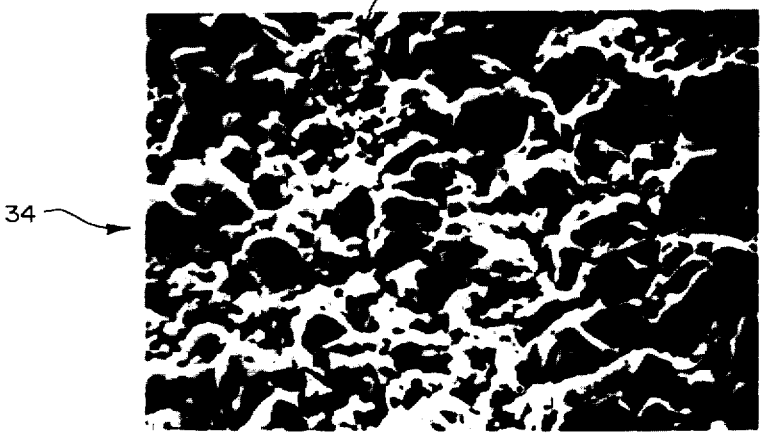

| LAMBDA | QUANTUM YIELD |
|---|---|
| 0.40 | 0.039 |
| 0.45 | 0.010 |
| 0.50 | 0.020 |
| 0.60 | 0.871 |
| 0.70 | 0.881 |
| 0.80 | 0.904 |
| 0.90 | 0.889 |
| 0.95 | 0.869 |
| 1.00 | 0.708 |

METHODS FOR FORMING THIN-FILM HETEROJUNCTION SOLAR CELLS FROM I-III-$VI_2$ CHALCOPYRITE COMPOUNDS, AND SOLAR CELLS PRODUCED THEREBY

Matter enclosed in heavy brackets [ ] appears in the original patent but forms no part of this reissue specification; matter printed in italics indicates the additions made by reissue.

The Government has rights in this invention pursuant to Contract No. EG-77-C-01-4042, Subcontract No. XJ-9-8021-1 awarded by the U.S. Department of Energy.

RELATED [APPLICATION] *APPLICATIONS*

*This is a reissue application of U.S. Pat. No. 4,335,266 which was issued on June 15, 1982 on application Ser. No. 221,761 filed on Dec. 31, 1980.*

Reid A. Mickelsen and Wen S. Chen, Ser. No. 278,343, filed July 2, 1981, for "Apparatus for Forming Thin-Film Heterojunction Solar Cells Employing Materials Selected from the Class of I-III-$IV_2$ Chalcopyrite Compounds", *now U.S. Pat. No. 4,392,451* .

BACKGROUND OF THE INVENTION

The present invention relates generally to solar cells and/or light-to-electrical energy transducers; and, more particularly, to thin layer p-n-type heterojunction solar cells formed from materials selected from the class of I-III-$VI_2$ chalcopyrite compounds—especially, a p-n-type heterojunction solar cell having a p-type layer of $CuInSe_2$ and an n-type layer of CdS—and, to methods of manufacture thereof, characterized in that the cells produced have relatively high energy conversion efficiency characteristics—e.g., closely approximating 10%, or greater—are highly stable, and can be formed with low cost fabrication methods on large area, low cost substrates; such characteristics resulting from the formation of a p-n-type heterojunction device wherein the p-n-type semiconductor layer formed initially comprises a transient p-n-type homojunction formed of a material selected from the class of I-III-$VI_2$ chalcopyrite compounds in which the p-type region of the transient p-type homojunctions is formed by vacuum deposition of a copper-enriched ternary composition or the like, and the transient n-type region is formed of a copper-deficient ternary composition or the like, with a layer of low resistivity n-type semiconductor material being vacuum deposited on the transient n-type region of the first semiconductor layer; whereupon interdiffusion of the elemental constituents in the multi-layer structure causes the transient n-type region of the first semiconductor layer to evolve into a p-type region, thereby producing a relatively low resistivity p-n-type heterojunction device essentially devoid of vacancies, voids, copper nodules and the like which tend to decrease conversion efficiencies; and, thereby enabling the formation of large area, thin film solar cells utilizing minimal amounts of critical semiconductor materials to form a low cost, stable, polycrystalline thin-film photovoltaic cell on low cost substrates by the use of low cost fabricating techniques.

Historically, some of the more perplexing problems faced by designers, manufacturers and users of conventional light-to-electrical energy transducers such, for example, as solar cells, have involved the need to improve: (i) the light energy collection efficiency of the cell; (ii) the conversion efficiency of light into electrical energy; and (iii), the cost involved per unit of power generated to produce such cells. Prior to the recent and continuing "energy crisis", research and development efforts have been primarily directed to the first two of the three above-identified factors. As a result, numerous types of solar cells have been designed which have enabled the production of solar cells suitable for use in laboratory experimentation, outer space applications, and the like, wherein the solar cells were relatively small area devices—e.g., on the order of 2"×2" —generally formed of single crystals which had to be grown and which were relatively expensive. Such crystals are characterized by their lack of grain boundaries; and, are generally limited in size, rarely being larger than about 5" in diameter and, usually, being considerably smaller. However, such devices have been known to achieve relatively high energy conversion efficiencies—sometimes ranging in the order of about 14% to about 16%. While such devices have been highly effective for their intended purposes, their field of practical use is greatly limited; and, they have simply not been satisfactory for generation of power on a practical economic commercial basis.

With the advent of the recent and continuing "energy crisis", efforts of researchers have been redirected; and, a considerable amount of work has been done in attempting to devise various types of energy producing systems which are: (i) environmentally safe; (ii) not constrained by limited natural resources; (iii) devoid of the hazards inherent with nuclear energy generating systems; and (iv), capable of producing sufficient energy to meet mankind's ever-increasing energy requirements on a cost-effective basis which is at least competitive with today's costs for gas, oil, and similar fossil-type fuels or the like. The present invention is believed to constitute the first real step towards attainment of this long sought-after objective.

PRIOR ART

A typical, but non-exhaustive, list of the types of conventional photovoltaic cells which were generated in and prior to the 1960's, and continuing into the 1970's, is illustrated by the disclosures contained in U.S. Pat. Nos. 3,186,874 to Gorski, 3,447,234 to Reynolds et al, 3,565,686 to Babcock et al, 4,086,101 to Jordan et al, and 4,101,341 to Selders. Briefly, the aforesaid Gorski patent relates to a polycrystalline thin-film CdS/Cu solar cell fabricated by vacuum deposition of from 20 μm to 100 μm of CdS onto a coated glass substrate, with the coated substrate then being electroplated with copper to form a barrier layer. The CdS layer is preferably doped by adding impurities to the evaporant powder.

In the Reynolds et al patent, the patentees evaporate CdSe powder on a glass substrate employing indium oxide/gold electrodes. After post-deposition heat treatment in a forming gas, a 20 Å copper overlay is deposited thereon and the device is again heat treated, with the copper acceptor altering the selenide resistivity, but not the carrier type.

In the Babcock et al patent, the patentees co-evaporate a mixture of CdS and CdSe powders with silver, copper or gold to form a thin-film photoconductor in which the metal impurities act as acceptor dopants.

In the Jordan et al patent, a thin-film CdS/$Cu_xS$ solar cell is formed on a glass sheet and coated with a transparent tin oxide. The CdS film is deposited by spraying a water solution containing a cadmium salt, a sulphur compound, and an aluminum containing compound, onto the substrate; while the $Cu_xS$ layer is formed by a chemical ion exchange process—for example, by dipping or electroplating.

The Selders patent refers to a polycrystalline thin-film heterojunction solar cell employing semiconducting selenides of cadmium and tin—i.e., n-type CdSe and p-type SnSe. Metallization of the device utilizes silver, indium, cadmium, zinc or gold. The device is formed by: (i) evaporation of both the CdSe and SnSe compounds; (ii) evaporation of CdSe followed by immersion in a tin solution to form SnSe by ion exchange; or (iii), spraying and thermally decomposing solutions containing the constituant elements.

Those interested in a comprehensive but non-exhaustive summary of the extensive work that has been carried out in the field of thin-film heterojunction solar cells, particularly in the 1970's, are referred to the following articles:

1. Wagner, et al, $CuInSe_2$/CdS Heterojunction Photovoltaic Detectors, APPL. PHYS. LETT., Vol 25, No. 8, pp. 434–435 (October 1974).
2. Shay, et al, Preparation and Properties of InP/CdS and $CuInSe_2$/CdS Solar Cells, PROC. 11th PHOTOVOLTAIC SPECIALISTS CONF., Phoenix, Ariz., p. 503 (1975).
3. Wagner, et al, p-InP/n-CdS Solar Cells and Photovoltaic Detectors, APPL. PHYS. LETT., Vol. 26, No. 5, p. 299 (1975).
4. Shay, et al, Efficient $CuInSe_2$/CdS Solar Cells, APPL. PHYS. LETT., Vol. 27, No. 2, pp. 89–90 (July 1975).
5. Tell, et al, Motion of p-n Junctions in $CuInSe_2$, APPL. PHYS. LETT., Vol. 28, No. 8, pp. 454–455 (April 1976).
6. Tell, et al, Photovoltaic Properties and Junction Formation in $CuInSe_2$, J. APPL. PHYS., Vol. 48, No. 6, pp. 2477–2480 (June 1977).
7. Tell, et al, Photovoltaic Properties of p-n Junctions in $CuInSe_2$, J. APPL. PHYS., Vol. 50, No. 7, pp. 5045–5046 (July 1979).
8. Kazmerski, Ternary Compound Thin Film Solar Cells, FINAL REPORT NSF/RANN/SE/AER 75-19576/PR/75/4, (October 1976).
9. Kazmerski, et al, Thin-Film $CuInse_2$/CdS Heterojunction Solar Cells, APPL. PHYS. LETT, Vol. 29, No. 4, pp. 268–270 (August 1976).
10. Kazmerski, et al, Growth and Characterization of Thin-Film Compound Semiconductor Photovoltaic Heterojunctions, J. VAC. SCI. TECHNOL. Vol. 14, No. 1, pp. 65–68 (January/February 1977).
11. Kazmerski, et al, $CuInS_2$ Thin-Film Homojunction Solar Cells, J. APPL. PHYS., Vol. 48, No. 7, pp. 3178–3180 (July 1977).
12. Kazmerski, Auger Electron Spectroscopy Studies of I-III-$VI_2$ Chalcopyrite Compounds, J. VAC. SCI. TECHNOL., Vol. 15, No. 2, pp. 249–253 (March/April 1978).
13. Kazmerski, et al, The Performance of Copper-Ternary Based Thin-Film Solar Cells, CONF. RECORD, 13th IEEE PHOTOVOLTAIC SPECIALISTS CONF., pp. 184–189 (June 5–8, 1978).
14. Kazmerski, et al, Fabrication and Characterization of ITO/$CuInse_2$ Photovoltaic Heterojunctions, CONF. RECORD 13th IEEE PHOTOVOLTAIC SPECIALISTS CONF., pp. 541–544 (June 5–8, 1978).
15. Clark, Molecular Beam Epitaxy Research on Copper Indium Diselenide, pp. 385–392, PROC. SOLAR ENERGY RESEARCH INSTITUTE REVIEW MEETING (Oct. 10, 1978).
16. White, et al, Growth of $CuInSe_2$ on CdS Using Molecular Beam Epitaxy, J. APP. PHYS., Vol. 50, No. 1, pp. 544–545 (January 1979).
17. White, et al, Growth of $CuInSe_2$ Films Using Molecular Beam Epitaxy, J. VAC. SCI. TECHNOL. Vol. 16, No. 2, pp. 287–289 (March/April 1979).
18. Kokubun, et al, Photovoltaic Effect in $CuInSe_2$/CdS Heterojunctions, Japan, J. APPL. PHYS., Vol. 16, No. 5, pp. 879–880 (1977).
19. Tomar, et al, ZnCdS/$CuInSe_2$ and CdS/ZnInSe Thin Film Solar Cells, paper presented at International Electronic Device Meeting, Washington, D.C., (1978).
20. Fleming, Cadmium Sufide/Copper Ternary Heterojunction Cell Research, Paper presented at Solar Energy Research Institute Review Meeting Covering Period from October 1977, through December 1978, pp. 393–420.
21. Piekoszewski, et al Rf-Sputtered $CuInSe_2$ Thin Films, paper presented at 14th IEEE PHOTOVOLTAIC SPECIALSTS CONFERENCE, CH 1508-1/80/0000-0980 (1980 IEEE).

It should be noted that Reference Nos. (1) through (7) above represent work performed at Bell Telephone Laboratories; while Reference Nos. (8) through (17) represent work carried out under the direction of L. L. Kazmerski at the University of Maine and, later, at the Solar Energy Research Institute.

The first reported experimental example of a CdS/$CuInSe_2$ heterojunction solar cell involves the work done at Bell Telephone Laboratories as reported in Reference Nos. (1) through (4), supra. This cell employed a single crystal of $CuInSe_2$ and a vacuum deposited CdS film; and, exhibited a uniform photovoltaic quantum efficiency of 70% between wavelengths of 0.55 $\mu$m to 1.2 $\mu$m. For an incident solar intensity of 92 mW/cm$^2$, the device produced a photocurrent of 38 mA/cm$^2$, an open circuit voltage of 0.49 v, and a conversion efficiency of 12%. Ongoing work by Bell Laboratories is described in Reference Nos. (5) through (7), supra. All of the foregoing prior art disclosures pertain to single crystal cells.

Following the development of the single crystal CdS/$CuInSe_2$ heterojunction solar cell by Bell Telephone Laboratories, extensive work was done by several researchers attempting to produce polycrystalline thin-film cells utilizing vacuum evaporation techniques for both CdS and $CuInSe_2$. Some of the very early work done in this area is reported in Reference Nos. (8) through (10) and (13), supra—work performed at the University of Maine under the direction of L. L. Kazmerski. The $CuInSe_2$ films used in these cells were formed by co-deposition of the $CuInSe_2$ and Se in order to form controlled resistivity p-type layers. Such cells have demonstrated photocurrents of 28 mA/cm$^2$, open circuit voltages of 0.49 v, and efficiencies on the order of 6.6% when tested with a light intensity of 100 mW/cm$^2$. Such cells have been approximately 1 cm$^2$ in area and have not been coated with any antireflection layers.

Subsequent reports from the University of Maine (e.g., Reference No. 11, supra) have dealt with $CuInS_2$ thin-film cells grown by a two-source method to form a homojunction. The base contact described is zinc/gold, while the top contact is indium. The cell demonstrated a relatively low conversion efficiency on the order of 3%. In Reference No. 14, supra, there is described an ITO/$CuInSe_2$ photovoltaic heterojunction which exhibited a conversion efficiency on the order of 8.5% in a single crystal device, but only 2.0% in a polycrystalline device.

Reference Nos. (15) through (17), supra, are illustrative of methods for forming $CuInSe_2$ thin-film cells utilizing Molecular Beam Epitaxy ("MBE") systems. However, as well known to those skilled in the art, MBE systems are simply not consistent with the demand for low-cost, large area solar cells; but, rather, are confined principally to the development of relatively small single crystal cells suitable for laboratory and/or experimental purposes.

In Reference No. (18), supra, Kokubun reports on the photovoltaic effect in a $CuInSe_2$/CdS heterojunction solar cell employing an evaporated gold ohmic contact on the photovoltaic material and demonstrating an efficiency of 5.6%. Tomar et al and Fleming (Reference Nos. 19 and 20, supra,) each report on p-type $CuInSe_2$ ternary heterojunction thin-film solar cells in which the semiconductor layers are deposited by evaporation techniques; whereas, Piekoszewski, et al (Reference No. 21, supra) reports on a similar cell wherein the $CuInSe_2$ thin-films are deposited by Rf-Sputtering techniques. In this latter case, the reported efficiency of the cell was on the order of 5%.

An overall general review of the state of the foregoing prior art has been set forth by Wagner, et al, Multicomponent Tetrahedral Compounds For Solar Cells, J. CRYSTAL GROWTH, Vol. 39, pp. 151-159 (1977), wherein the authors provide an overall review of the use of chalcopyrite-type semiconductors and the development of the high efficiency single crystal $CuInSe_2$/CdS cell by Bell Laboratories and the thin-film $CuInSe_2$/CdS cells developed at the University of Maine. While this review reports on many different types of solar cells and the constituent materials from which they have been made, in general it has been found that there have been only four combinations of materials which have been utilized and which have provided conversion efficiencies exceeding 10%—viz., (i) silicon; (ii) GaAs/$Ga_xAl_{1-x}As$; (iii) InP/CdS; and (iv), $CuInSe_2$/CdS—and, in each and every instance, prior to the advent of the present invention, those devices described that did exceed a 10% energy conversion figure were in single crystal form—i.e., a form which inherently precludes the use of low cost fabrication techniques and the application of thin-layer films on large area substrates (See, e.g., Reference No. 10, supra, p. 65). On the other hand, conversion efficiencies of less than 10% and, particularly, in the range of from about 2% to about 7%—the range most commonly attained in the prior art—require such tremendous support systems and dedication of ground space that the systems are neither viable nor practical from a commercial energy producing standpoint, even where they meet the requisite of low cost. Therefore, one of the principle directions in which researchers have been extending their efforts has been towards the formation of thin-layer, heterojunction solar cells preferably formed of chalcopyrite materials which are suitable for application to large area substrates—i.e., which are capable of approximating and, preferably, exceeding 10% conversion efficiencies.

But, prior to the advent of the present invention, not one of the thin-layer, heterojunction, polycrystalline-type, large area solar cells reported on have begun to approach conversion efficiencies on the order of 10%; including a p-type $CuInSe_2$ and n-type CdS heterojunction solar cell described by Reid A. Mickelsen and Wen S. Chen in an article entitled High Photocurrent Polycrystalline Thin-Film CdS/$CuInSe_2$ Solar Cell, APP. PHYS. LETT., Vol, 36, No. 5, pp. 371-373 (1980) wherein the maximum conversion efficiency attained was found to be 5.7% under simulated 100 $mW/cm^2$ solar ilumination.

One problem that has been repeatedly faced by researchers involves the conflicting characteristics of chalcopyrite materials which are, on the one hand, sometimes low resistivity p-type chalcopyrite materials and, on the other hand, either n-type chalcopyrite materials or high resistivity p-type chalcopyrite materials. That is, in the case of low resistivity p-type chalcopyrite materials which are exposed to CdS, researchers have been continually plagued by the creation of a high resistivity region in the CdS layer, generating voids and vacancies in the chalcopyrite semiconductor materials which commonly take the form of copper nodules. Such nodules, are highly undesirable, either serving to increase the resistivity of the n-type CdS layer or forming large defects and resulting in significantly lower conversion efficiency. At the same time, however, it has been known by persons skilled in the art that the formation of undesirable copper nodules is not prevalent when using either high resistivity p-type chalcopyrite materials or n-type chalcopyrite materials. Unfortunately, however, usage of high resistivity p-type chalcopyrite materials has tended to lead to rapid degradation of the cell with such cells being characterized by their lack of stability and somewhat low conversion efficiencies. Of these two problems, researchers have found that the problems produced by copper nodules are of such a magnitude that the prior art has generally tended to develop thin-film, large area cells fabricated from relatively high resistivity p-type chalcopyrite semiconductor materials with the consequent result that conversion efficiencies have generally plateaued in the region of from about 5% to about 7%.

SUMMARY OF THE INVENTION

Accordingly, it is a general aim of the present invention to provide improved light transducers such, for example, as solar cells—especially, large area, thin-film heterojunction cells formed from materials selected from the class of I-III-$VI_2$ chalcopyrite compounds—and to provide improved methods for forming such cells, which overcome the foregoing disadvantages inherent with prior art thin-film transducers and manufacturing processes and which permit the formation of large area thin-film cells characterized by their high energy conversion efficiencies—efficiencies approaching on the order of 10%, or greater—and, wherein the cells do not exhibit excessive voids, vacancies and/or the formation of copper nodules in the semiconductor layers.

In one of the its principal aspects, it is an object of the invention to provide improved methods for forming large area, low cost, stable, polycrystalline, thin-film photovoltaic cells on low cost substrate materials utilizing low cost fabricating methods.

An ancillary object of the invention is the provision of improved methods for forming low cost thin-film solar cells which, for the first time, are economically competitive with more conventional gas, oil and similar fossile fuel type energy generating systems, as well as with more exotic nuclear energy generating systems, and which readily permit the formation of such improved cells on a large scale production basis, yet wherein the solar cells produced are environmentally safe and essentially hazard-free.

A further objective of the invention is to provide improved low cost thin-film cells, and methods for manufacture thereof, wherein the cells are characterized by their stability and wherein energy conversion efficiency does not degrade even after months of storage, and even without encapsulation.

In another of its important aspects, it is an object of the invention to provide an improved p-n-type heterojunction device formed of materials selected from the class of I-III-$VI_2$ chalcopyrite materials wherein the semiconductor materials in the p-type region of the p-n-type heterojunction initially define a high resistivity transient n-type layer deposited upon the initial p-type layer and, wherein such high resistivity transient n-type layer ultimately evolves (by interdiffusion) into a high resistivity p-type layer; and, wherein the initially deposited low resistivity p-type layer is characterized by: its high adherence; low contact resistance; a back surface field effect; large, relatively uniform grain size; and, moreover, the low resistivity p-type layer acts as an important source for electrically active species to diffuse into subsequent film layers.

Another general objective of the invention is to provide an improved p-n-type heterojunction device characterized by a p-side being predominantly single phase chalcopyrite structure.

A further objective of the invention is the provision of improved methods for forming large area thin-film heterojunction solar cells which readily permit of reproducibility of cells having desired energy conversion efficiencies.

Briefly stated, the foregoing objectives are attained by forming a p-n-type heterojunction wherein the p-type semiconductor layer comprises: (i) a low resistivity p-type material; and (ii), a relatively high resistivity transient n-type material having the same elemental composition—preferably, $CuInSe_2$—but, employing differing ratios of the elemental constituents copper and indium (or other type I-III elements), thereby defining a transient p-n-type homojunction; and, thereafter, vacuum depositing thereon a low resistivity n-type semiconductor material—preferably an indium-doped CdS layer—whereupon interdiffusion between the transient high resistivity n-type layer and the adjacent low-resistivity p-type and n-type layers causes the transient n-type layer and the transient homojunction to evolve into a composition graded p-type layer, thereby producing a p-n-type heterojunction device essentially devoid of excessive voids, vacancies and copper nodules and which is characterized by relatively high energy conversion efficiency.

DESCRIPTION OF THE DRAWINGS

These and other objects and advantages of the present invention will become more readily apparent upon reading the following detailed description and upon reference to the attached drawings, in which:

FIG. 7 is a highly magnified (2000×) microphotograph of a typical low resistivity $CuInSe_2$ film formed in accordance with conventional prior art methods and taken at an oblique angle to the surface of the cell, here depicting particularly the resulting copper nodules that are formed with such materials; even in the presence of only minimal amounts of CdS;

FIG. 8 is a highly magnified (2000×) microphotograph taken at an oblique angle to the surface of the solar cell, here detpicting the cell shown in FIG. 7 after application of a low resistivity n-type CdS semiconductor layer thereon;

FIG. 9 is a highly magnified (2000×) microphotograph taken at an oblique angle to the surface of the solar cell and similar to the presentation in FIG. 7, but here illustrating a first "composition-graded" $CuInSe_2$ layer vacuum deposited on the substrate in accordance with the present invention and illustrating particularly the absence of copper nodules;

FIG. 10 is a microphotographic view of a portion of the surface depicted in FIG. 9, here shown at 5000× magnification;

Figure 1:
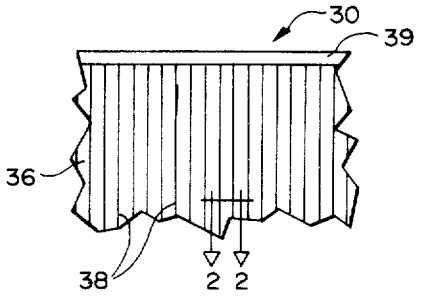
FIG. 1 is a highly diagrammatic plan view, somewhat enlarged in scale, here depicting a fragmentary portion of a large area thin-film cell which is here representative of the general external visual appearance of both conventional thin-film cells and cells made in accordance with the present invention, here depicting the current collecting electrodes in highly exaggerated spread form, it being understood that in actuality the electrodes would appear as relatively closely spaced, generally parallel, fine lines on the order of 25 $\mu$m in width.

While the invention is susceptible of various modifications and alternative forms, specific embodiments thereof have been shown by way of example in the drawings and will herein be described in detail. It should be understood, however, that it is not intended to limit the invention to the particular forms disclosed but, on the contrary, the intention is to cover all modifications, equivalents and alternatives falling within the spirit and scope of the invention as expressed in the appended claims.

DETAILED DESCRIPTION

Figure 2:
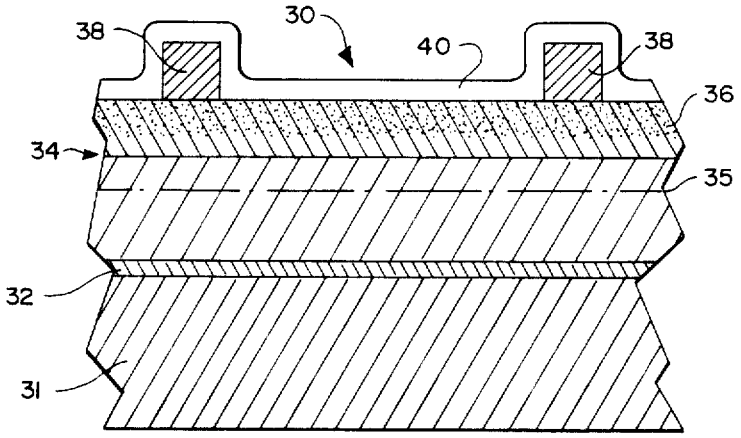
FIG. 2 is a fragmentary, highly diagrammatic sectional view of a thin-film cell embodying features of the present invention, here taken for purposes of illustration substantially along the line 2—2 in FIG. 1, it being understood that the dimensional relationships illustrated are in exaggerated form for purposes of clarity and that in actuality such a cell will normally have an overall thickness on the order of only about 5.0 $\mu$m.

Turning now to FIGS. 1 and 2 conjointly, a fragmentary portion of an exemplary thin-film p-n-type heterojunction solar cell, generally indicated at 30, has been diagrammatically illustrated. As the ensuing description proceeds, it will become apparent that the illustrative solar cell 30 may readily be formed with low cost, large area, fabrication techniques on low cost, large area substrate materials. Nevertheless, such a cell may also be formed on an experimental laboratory basis in relatively small area sizes—say, for example, 2 cm×2 cm. Dependent upon the particular end results desired, the thicknesses of the various layers of the cell 30 may vary somewhat; but, in general, thin-layer heterojunction cells of the type to be described herein will commonly have an overall thickness (excluding the thickness of the substrate material which may be on the order of approximately 0.025") ranging from about 5.0 μm to about 10.0 μm. Such thin-film cells are to be contrasted with the more conventional single crystal, silicon-type solar cells and concentrator solar cells wherein the thickness of the active portions of the cell may range from 200 μm to 400 μm.

The exemplary cell depicted in FIGS. 1 and 2 is representative, at least in visual appearance, of both thin-film cells embodying the features of the present invention and cells formed of similar materials, but made in accordance with the processes known in the prior art. See, e.g., Reference Nos. (8) through (21), supra. In either case, the active layers of the cell are deposited on a suitable substrate 31, which is here preferably formed of aluminum oxide ($Al_2O_3$) having a thickness on the order of 0.025". While the highest efficiencies achieved with cells made in accordance with the present invention have been attained utilizing cells having $Al_2O_3$ substrates 31 in the form of a polycrystalline alumina, it is believed that other materials can also be used including, for example, glazed alumina, enameled steel, metal foils, and similar inert inorganic materials, provided only that the material selected is capable of withstanding the process temperatures involved which range up to about 500° C.

A suitable base contact 32 is applied directly to one surface of the substrate 31. Again, in carrying out the present invention we have found that excellent results are attained when using molybdenum (Mo); but, again, it is believed that other materials could be used without departing from the spirit and scope of the invention. For example, a molybdenum/gold material could be used and, perhaps, other materials such as the more conventional nickel and graphite materials which have been commonly employed in conventional solar cells.

The essence of any light-to-electrical energy transducer, be it a conventional prior art-type solar cell or a solar cell made in accordance with the present invention, lies in the photoactive semiconductor materials defining the junction, generally indicated at 34 in FIG. 2, which may comprise a p-n-type junction or an n-p-type junction of either the homojunction variety (wherein the junction is formed by impurity diffusion or implantation into one surface of the photoactive semiconductor material), or of the heterojunction variety (wherein the junction is defined at the interface between two different semiconductor materials, one of which is an n-type material and the other of which is a p-type material). The present invention relates to this latter type of junction device—viz., a heterojunction device—here consisting of first and second respectively different semiconductor layers 35, 36. Moreover, while it is believed that the present invention may well find applicability with n-p-type heterojunction devices, particularly in the case of non-solar cell applications having band gap energies of greater than 1.5 ev, it will herein be described in connection with an exemplary p-n-type heterojunction 34 suitable for use as a solar cell having a relatively narrow band gap energy ranging from about 1 to 1.5 ev, and suitable for use as a solar cell having a first semiconductor layer 35 formed of p-type material and a second semiconductor layer 36 formed of n-type material.

Historically, a wide range of photovoltaic materials have been used with varying degrees of success in the formation of solar cell semiconductors. Recently, however, the potential utilization of ternary chalcopyrite compounds (see, e.g., Reference Nos. 1-21, supra) as alternatives to the more conventional photovoltaic materials has been demonstrated; and, indeed, the desirability of utilizing materials selected from the class of I-III-$VI_2$ chalcopyrite compounds has stirred particular interest.

Properties of potential solar cell materials selected from the class of I-III-$VI_2$ chalcopyrite compounds have been set forth in Table I. Such materials all have band gaps near the optimum value for terrestrial solar energy conversion. They are direct band gap semiconductors which minimize the requirement for long minority carrier diffusion lengths. Except for $CuGaSe_2$, which has only exhibited p-type behavior, the other three ternary compounds have been grown as both n-type and p-type crystals. Thus, construction of homojunction devices is possible. These chalcopyrite compounds can also be paired with CdS to potentially make efficient p-n-type heterojunction solar cells because they have compatible lattice structures with acceptable lattice mismatches, and favorable differences of electron affinities. When used in applications other than solar cells, other I-III-$VI_2$ compounds may be employed such, for example, as: $AgInS_2$; $AgGaSe_2$; $AgGaTe_2$; $AgInSe_2$; $CuGaTe_2$; $AgInTe_2$; and $CuGaS_2$.

TABLE 1

PROPERTIES OF POTENTIAL SOLAR CELL I-III-$VI_2$ Materials

| Material | Eg(ev) (300° K.) | Transition | Lattice Constant (Å) a | Lattice Constant (Å) c | Mismatch With CdS (%) | Mobility ($cm^2 V^{-1}S^{-1}$) (300° K.) n | Mobility ($cm^2 V^{-1}S^{-1}$) (300° K.) p | Electron Affinity (ev) |
|---|---|---|---|---|---|---|---|---|
| $CuGaSe_2$ | 1.68 | direct | 5.618 | 11.01 | 3.8 | — | 20 | — |
| $CuInS_2$ | 1.55 | direct | 5.523 | 11.12 | 5.56 | 200 | 15 | — |
| $CuInSe_2$ | 1.04 | direct | 5.782 | 11.62 | 1.16 | 320 | 10 | 4.58 |
| $CuInTe_2$ | 0.96 | direct | 6.179 | 12.36 | 5.62 | 200 | 20 | — |
| CdS | 2.42 | direct | 4.136 | 6.716 | — | 250 | — | 4.5 |

These materials, in general, have band gap energies outside the range of 1–1.5 ev most desirable for solar cells and, in addition some have exhibited only n-type behavior (e.g., $AgInS_2$ and $AgInSe_2$) while $AgGaSe_2$ is only suitable as a high resistivity photovoltaic material.

Reported performances of solar cells based on ternary compounds selected from the class of I-III-$VI_2$ chalcopyrite compounds are set forth in Table II. The high efficiency of the single crystal device described in Reference Nos. (1) through (4), supra, as well as the polycrystalline nature of the exemplary thin-film devices here under consideration, has led to the description herein of a preferred form of the invention employing a $CuInSe_2$/CdS photovoltaic p-n-type semiconductor junction 34; and, such devices have been found to provide excellent low cost power generation systems capable of operating at practical and viable power conversion efficiencies which are "cost-competitive" with the more conventional fossil fuel power generating systems, as well as with the more exotic nuclear energy generating systems, all as herein described in connection with the present invention.

TABLE II

REPORTED PHOTOVOLTAIC EFFICIENCY

| Material | Efficiency (%) Single Crystal | Efficiency (%) Thin-Film |
|---|---|---|
| CdS/$CuGaSe_2$ | 5 | — |
| CdS/$CuInS_2$ | — | 3.25 |
| CdS/$CuInSe_2$ | 12 | 6.6, 5.7 |
| CdS/$CuInTe_2$ | No significant photovoltaic effect | |
| n, p $CuInS_2$ | — | 3.6 |
| n, p $CuInSe_2$ | — | 3.0 |

Finally, in order to complete the exemplary cell 30 depicted in FIGS. 1 and 2, there is provided a suitable grid contact pattern which is deposited on the upper surface of the semiconductor layer 36 defining a portion of the junction 34. In the illustrative cell depicted at 30 in FIGS. 1 and 2, the contact grid comprises a plurality of generally parallel, fine-line electrodes 38 which are electrically connected to a suitable current collecting electrode 39 (FIG. 1) which is here illustrated as being disposed at, or adjacent to, the edge of the photoactive region of the cell; but which may, if desired, be deposited on top of the photoactive region of the cell. Such positioning does, however, reduce the optical transparency of the system. The grid-type electrodes 38, 39 may be formed of various materials; but, it is essential that such materials be characterized by their high conductivity and their ability to form a good ohmic contact with the underlying semiconductor layer 36. In the practice of the present invention, excellent results have been attained utilizing aluminum which readily permits of through-mask vacuum deposition with conventional fabricating techniques and which is characterized by high conductivity characteristics and excellent ohmic contact characteristics, particularly when the underlying semiconductor comprises CdS or the like. However, other materials might be used such, for example, as indium, chromium, molybdenum and similar materials to form an interface providing the desired ohmic contact characteristics with a superimposed electrode material such, for example, as copper, silver, nickel or the like.

To improve the light collection efficiencies of the solar cell 30, the laminated thin-film device herein described is conventionally provided with an antireflective coating 40 in a manner well known to persons skilled in the art. Again, while the particular material used to form the antireflective coating 40 is not critical to the present invention, excellent results have been attained when using an antireflective coating formed of SiOx—a suboxide of silicon wherein "x" varies between "1" and "2" dependent upon the deposition parameters employed. Particularly excellent results have been achieved when the value of "x" is on the order of about "1.8". However, as indicated, other materials can be utilized including, for example, $SiO_2$, aluminum oxide, tantalum oxide, etc., although preferably the antireflective coating will be selected from a material having a refraction index of about 1.55.

Figure 3:
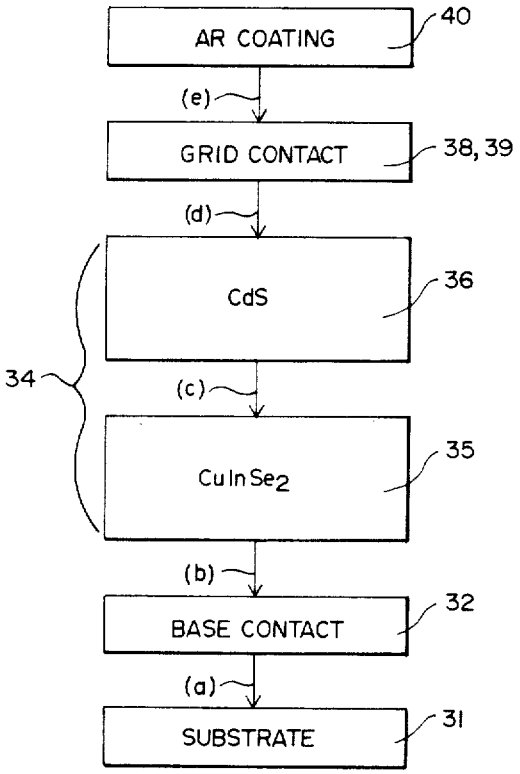
FIG. 3 PRIOR ART
FIG. 3 is a diagrammatic block-and-line representation of a process as heretofore commonly employed for forming, for example, conventional prior art thin-film $CdS/CuInSe_2$ heterojunction cells.

Referring next to FIG. 3, there has been diagrammatically illustrated in block-and-line form a typical step-by-step process for forming a thin-film heterojunction device of the types disclosed in Reference Nos. (1) through (21), supra; and, particularly, those conventional prior art solar cells formed utilizing a ternary chalcopyrite material for one semiconductor layer and CdS as the second semiconductor layer, with the two layers defining a heterojunction. Thus, as here shown, in step (a) a suitable base contact 32 is applied to substrate 31 in any of the well known conventional manners such, for example, as by Rf-Sputtering techniques, vacuum deposition, or the like. Thereafter, the first semiconductor layer 35, which is here shown as a ternary chalcopyrite compound and, more particularly, as $CuInSe_2$, is then applied to the base contact 32 during step (b), generally by vacuum deposition techniques.

Following application of the first semiconductor layer 35, the second semiconductor layer 36, which is here shown for illustrative purposes to be CdS, is preferably vacuum deposited in step (c) on the first semiconductor layer 35, with the two layers 35, 36 defining a heterojunction type device 34. Thereafter, the grid contact arrangement 38, 39 is applied to the surface of the upper semiconductor 36 during step (d); conventionally, by means of through-mask evaporation techniques. Finally, an antireflective coating 40 is applied to the upper surface of the cell over the grid contact pattern and the exposed portions of the semiconductor layer 36 during step (e). As those skilled in the art will appreciate, the conventional process parameters employed in terms of vacuum parameters, temperature parameters, and/or intermediate heating steps have been eliminated from the above discussion simply for purposes of clarity; but, it will be understood that the conventional process would include utilization of such process parameters.

Figure 4:
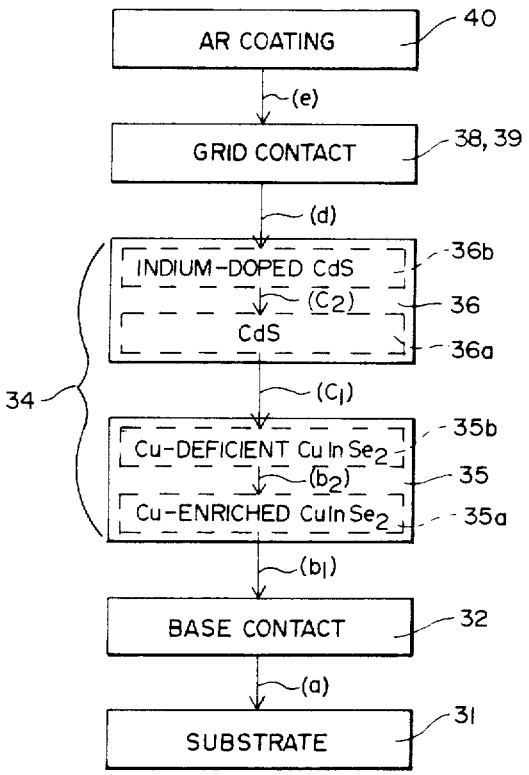
FIG. 4 is a view similar to FIG. 3, but here illustrating a step-by-step process for forming large area thin-film heterojunction cells in accordance with the present invention.

Turning now to FIG. 4, and simply for purposes of facilitating a broad, general, preliminary understanding of the differences between the process of the present invention and the conventional process shown in FIG. 3, there has been illustrated in step-by-step, block-and-line form an exemplary process preferably utilized to form thin-film heterojunction solar cells in accordance with the present invention. As here illustrated, the base contact 32 is applied directly to the surface of the substrate 31 in step (a) in a manner which can be essentially the same as that described in step (a) of the prior art process depicted in FIG. 3. In the formation of experimental laboratory type thin-film heterojunction solar cells embodying the features of the present invention, such application has been by Rf-Sputtering techniques wherein the substrate is neither heated or cooled but, is generally disposed on a water cooled platen. Those skilled in the art will appreciate that such Rf-Sputtering techniques generally generate considerable heat, serving to heat the substrate 31 by several hundred degrees.

The principal process difference between the methods embodying features of the present invention and those utilized in the prior art resides in the process parameters employed to form the thin-film heterojunction 34. More specifically, in the practice of the present invention, the first semiconductor layer 35 is applied by a vacuum deposition technique and, during the vacuum deposition process the copper/indium ratio is carefully controlled in a manner to be hereinafter described in greater detail. That is, during the first portion of the vacuum deposition process, the copper/indium ratio in the ternary $CuInSe_2$ compound is controlled to provide a slightly copper-enriched composition. More specifically, as contrasted with a stoichiometric composition wherein the $CuInSe_2$ is neither a p-type nor an n-type material, in the initial portion of the process for applying the semiconductor 35, a slight copper excess on the order of about 5% to 10% is provided so as to form a first region 35a during step ($b_1$) which is basically a low resistivity p-type semiconductor region. At that point in the process when the thickness of the semiconductor layer 35 is generally on the order of between 50% and 66.7% of the desired total thickness, the copper/indium ratio is adjusted so that the ternary material being applied during the step ($b_2$) in the vacuum deposition process is slightly copper-deficient—e.g., on the order of up to about 5% copper-deficient—so as to form a moderately high resistivity n-type region 35b which is deposited directly upon the copper-enriched region 35a. Thus, the two regions 35a and 35b of semiconductor layer 35 define a composition gradient in the ternary chalcopyrite materials from which semiconductor 35 is formed; and, indeed, the two regions 35a, 35b define a transient p-n-type homojunction. Such p-n-type homojunction is termed "transient" because the copper deficient region 35b tends to be a moderately high resistivity transient n-type region which, through interdiffusion with respect to its adjacent region 35a and layer 36, evolves into a p-type region, thereby defining a "composition-graded" p-type semiconductor layer 35.

In carrying out the present invention, the uppermost semiconductor layer 36 in the exemplary device is an n-type layer and, preferably, an n-type CdS semiconductor layer. Desirably, this layer 36 is a low resistivity layer; and, to achieve this desired result, the CdS layer 36 is vacuum deposited on the first semiconductor layer 35 in a carefully controlled process wherein CdS is deposited during step ($c_1$) to a depth generally on the order of about 0.8 μm and, thereafter, the CdS deposited in the remaining thickness of layer 36 is indium-doped to insure low resistivity characteristics. Thus, the layer 36 comprises a underlying CdS region 36a which is essentially undoped and an overlying indium-doped region 36b.

Steps (d) and (e) for respectively applying the grid contacts 38, 39 and the antireflective coating 40 are, for purposes of an understanding of the broader aspects of the present invention, essentially similar to steps (d) and (e) described above in connection with FIG. 3.

Figure 5:
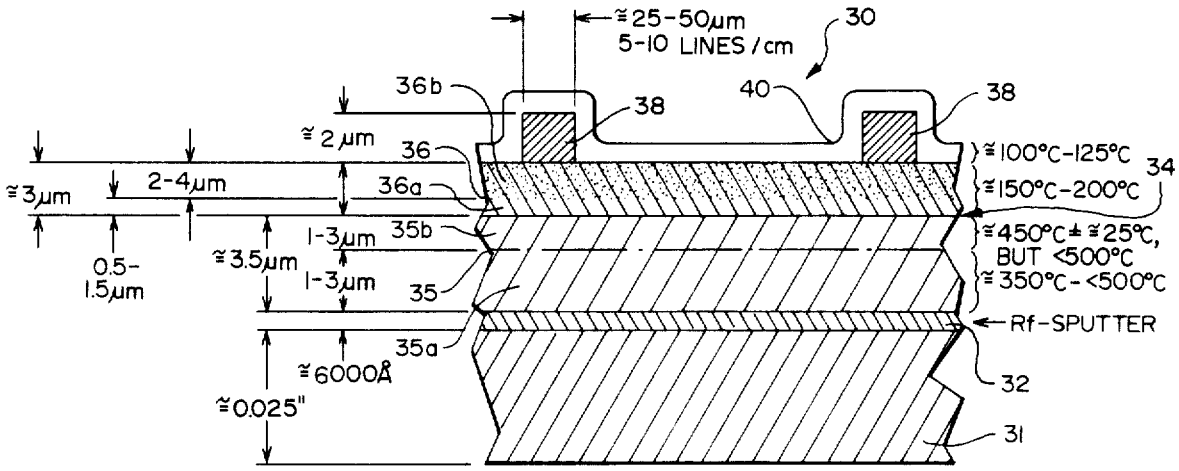
FIG. 5 is a highly diagrammatic view here depicting in vertical sectional format the discrete laminations forming cells manufactured in accordance with the present invention with representative and preferred process temperature and product thickness parameters set forth for each different lamination.

Turning next to FIG. 5, there has been diagrammatically illustrated an exemplary thin-film heterojunction device formed of materials selected from the class of $I\text{-}III\text{-}VI_2$ chalcopyrite compounds and which results from the process hereinabove described generally in connection with FIG. 4. Thus, as here illustrated, the polycrystalline thin-film $CuInSe_2$/CdS cells made in accordance with the present invention are prepared on metallized alumina ($Al_2O_3$) substrates 31 which are generally on the order of about 0.025" thick by deposition thereon of a thin metal molybdenum (Mo) film or the like—for example, a film on the order of about 6000 Å in thickness—such film having been applied in an experimental laboratory procedure by Rf-Sputtering techniques suitable for forming a low cost metallization for the cells. The Mo layer 32 has been found to be stable, of low resistivity—0.2Ω/□ for films of 6000 Å thickness—highly adherent, and to have formed excellent ohmic selenide contacts. Sputtering was done in 6 μm of argon with a power of 10.0 W/in.$^2$ for about 60 minutes.

In keeping with the important aspects of the present invention, the exemplary p-n-type heterojunction 34 is then applied in the manner described above in connection with FIG. 4. More specifically, the first semiconductor layer 35 is deposited in two discrete superimposed regions 35a, 35b with the overall thickness of the layer 35 preferably being on the order of approximately 3.5 μm. Region 35a, which is preferably in the range of 1.0 μm to 3.0 μm, is the ternary chalcopyrite compound deposited by simultaneous elemental evaporation at a temperature on the order of about 350° C.; although, less preferable higher temperatures ranging up to about 500° C. can be employed. In the laboratory environment wherein the illustrative photocell 30 was initially fabricated, the region 35a was deposited to a desirable thickness during a period of 40 minutes; such thickness comprising in the range of from 50% to 66.7% of the overall desired thickness for layer 35.

At the completion of that time, and further in accordance with the invention, the copper/indium ratio was then adjusted during the simultaneous elemental evaporation process so as to provide a simultaneous elemental vapor stream that was slightly copper-deficient, thereby forming the copper-deficient, moderately high resistivity, transient n-type region 35b. During the course of this simultaneous elemental evaporation process which lasted for 20 minutes in the laboratory environment herein described, the temperature parameter was raised from 350° C. to approximately 450° C. during the last quarter of the overall evaporation process used to deposit layer 35—i.e., at about the 45 minute mark or, about 5 minutes after adjusting the copper/indium ratio from a copper-enriched ternary compound to a copper-deficient ternary compound. While excellent results have been achieved utilizing temperature parameter on the order of 450° C. during the last quarter of the foregoing evaporation step, it has been found that the temperature may fall generally in the range of 450°± and 25° C., but it has been found that the temperature should be maintained at less than about 500° C.

At this point in the process, the second semiconductor layer 36—here, preferably, a low resistivity n-type CdS layer—is applied to the previously applied composition-graded transient p-n homojunction formed by semiconductor layer 35. Preferably, the low resistivity n-type layer 36 is on the order of about 3 μm in thickness, consisting of a first undoped CdS region 36a ranging in thickness from about 0.5 μm to about 1.5 μm, and a superimposed indium-doped region 36b ranging in thickness from about 2.0 μm to 4.0 μm. To this end, the process temperature was decreased in the laboratory experiment to a temperature ranging between 150° C. and about 200° C. The solar cell produced having the highest energy conversion efficiency—an efficiency of ≅9.53%—was prepared utilizing a temperature of 200° C. during the CdS vaporization process. At the lower temperature of 150° C., sheet resistivity for CdS films ranging in thickness from 3.0 μm to 5.0 μm was in the range of 60–200 KΩ/□. In the exemplary cells, after deposition of approximately 0.8 μm of pure CdS, the CdS films were doped with indium (≅1.5%) by co-evaporation. Such doping formed a very low resistivity region (30–100 Ω/□) in contact with the subsequently deposited grid structure 38, 39.

Chamber pressure during all selenide depositions was maintained at $3\text{–}8\times10^{-6}$ torr.

In keeping with the invention, the grid contacts 38, 39 (FIGS. 1, 2 and 5) were applied on top of the CdS semiconductor layer 36 utilizing conventional through-metal mask techniques and an evaporation system employing an electron gun source (not shown) for aluminum deposition. The grid lines or electrodes 38 are preferably on the order of about 2.0 μm in thickness and are extremely fine electrode lines ranging in width from about 25 μm to 50 μm. The exemplary laboratory solar cells were formed utilizing grid lines of approximately 25 μm in width with ten equally spaced parallel lines per centimeter, defining a transparent grid structure exposing from 93% to 95% of the underlying semiconductor layer 36. Finally, an $SiO_x$ antireflective coating (where "x" is equal to approximately "1.8") was applied by vacuum evaporation at temperatures ranging from 100° C. to 125° C.

In the formation of thin-film heterojunction solar cells in accordance with the present invention, it has been found that the electrical properties of the $CuInSe_2$ are extremely sensitive to the copper/indium ratio. Indeed, it has been found that variation in that ratio of only a few percentage points results in resistance gradients of $10^4$ to $10^5$. Consequently, by simply adjusting the relative evaporation rates of the copper and indium, it is possible to achieve the desired film properties. It has also been found that control of the selenium is not critical.

Figure 6:
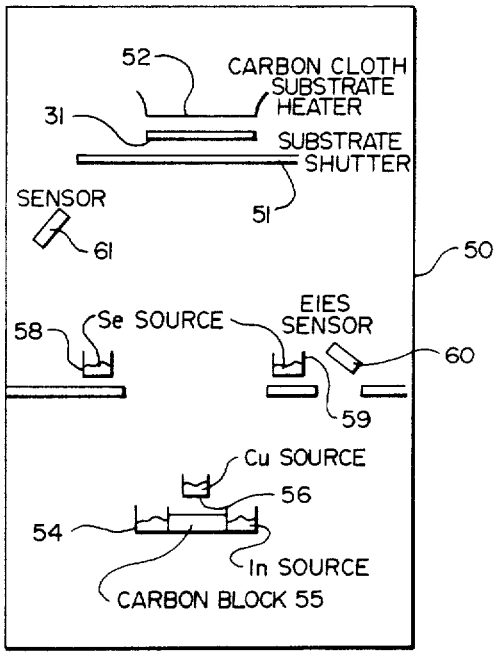
FIG. 6 is a highly diagrammatic vertical sectional view of an exemplary system configuration for preparing thin-film $CuInSe_2$ films on solar cell substrates, it being understood that the system here depicted for illustrative purposes only is commonly the type of system used in laboratory work for forming relatively small cells which may, for example, be on the order of 1–10 $cm^2$.

Referring now to FIG. 6, there has been illustrated an exemplary laboratory system for forming heterojunctions 34 embodying the features of, and made in accordance with the methods of, the present invention. As here shown, the system employs a conventional enclosed vacuum chamber, diagrammatically depicted at 50. The substrate 31 is positioned between a shutter 51 and a suitable heating device 52 such, for example, as a carbon cloth substrate heater. The metallic elements (i.e., type I-III elements such as copper and indium) for the ternary chalcopyrite compound—e.g., $CuInSe_2$—are positioned within a crossed boat source configuration for copper and indium vaporization. Thus, the indium source is deposited within a first boat 54 having a carbon block 55 positioned centrally within the boat to form two sources of indium vapor, one on either side of the block 55. Positioned above the carbon block 55 and oriented at right angles to the boat 54 is a second boat 56 containing the copper source. In the laboratory experimental set-up, both boats: (i) were made of tungsten; (ii) contained an alumina barrier; and (iii) were obtained from R. D. Mathis Company, Long Beach, Calif. Boat widths of ½" and ¾" for copper and indium, respectively, as well as ¾" for both materials, were found acceptable. The vertical spacing between the boats 54, 56 was approximately ⅛". The selenium source was contained within a pair of boats 58, 59 installed at opposite ends of, and below, the substrate 31 to insure deposition uniformity. However, a single selenium source has also produced satisfactory results.

In carrying out the present invention, a dual-channel co-evaporation controller employing the principals of Electron Impact Emission Spectroscopy (EIES) was provided for both monitoring and controlling the indium/copper ratio. In the experimental system, the dual-channel co-evaporation controller was a model manufactured by Inficon, located in New York, and identified as Inficon's model "Sentinel 200". While such EIES systems are well known to persons skilled in the art—see, for example, Schumacher U.S. Pat. No. 3,612,859—and need not be described in detail, a brief description may be of some assistance in facilitating an understanding of the present invention. With this system, the sensor 60 of the EIES controller (FIG. 6) was positioned so as to permit evaporated materials in the vapor stream emanating from the crossed boats 54, 56 to enter the miniature sensor structure (not shown) wherein the evaporant is cross-bombarded by a low energy electron beam. A fraction of the atoms are excited during the collision process. In the excited state, the outer shell electrons of these atoms are raised to energy levels higher than the normal ground state. Almost immediately, most of the excited atoms cascade to lower energy states, emitting photons with specific energies or wavelengths. These wavelengths are generally in the 2000 Å to 4500 Å ultraviolet light region and are precisely characteristic of the atomic species. The number of photons emitted (light intensity) is proportional to evaporant density in the sensor so that light intensity is then proportional to evaporation rate. By the use of narrow band pass optical filters and/or monochrometers (not shown), two specific materials can be simultaneously monitored and rate controlled. In the illustrative system, the EIES controller was equipped with an optical band pass filter (4500 Å) on one channel to monitor indium, and a monochrometer set at 3250 Å on the other channel to monitor copper. The sensor 60 was mounted on the chamber bell-jar 50 and positioned above, but off axis from, the crossed boat configuration 54, 56.

While the EIES sensor was used to monitor and control evaporation of indium and copper, a quartz crystal microbalance deposition controller 61 was provided for controlling the selenium vaporization rate from the boats 58, 59. Suitable shields (not shown) were provided to prevent exposure of the EIES controller to selenium. Of course, the particular sensor/controller employed can vary dependent upon specific system requirements. For example, the system may employ a Mass Analyzer or a quadrupole-type analyzer, etc. But, we have found that excellent results are attained using an EIES system.

During the course of formation of p-n type heterojunctions 34 in accordance with the present invention, the controllers 60, 61 were adjusted to insure relative elemental evaporation rates sufficient to produce p-type films of 5 KΩ/□ to 800 KΩ/□ sheet resistivity for films having thicknesses ranging from 2 μm to 3 μm. Typical deposition rates were 2 Å/sec. for indium, 0.9 Å/sec. for copper, and 8–15 Å/sec. for selenium, which resulted in a $CuInSe_2$ deposition rate of 8 Å/sec. Sheet resistivity as a function of substrate position indicated excellent uniformity (±10% for low resistivities and a factor of 2–3 for high resistivities) was achieved. Reflection and transmission electron difraction confirmed that the layers deposited were single phase, chalcopyrite $CuInSe_2$ and that grain sizes in excess of 10 μm were present in the low resistivity of p-type region 35a.

As previously indicated, one of the principal problems encountered in the formation of thin-film, p-n-type heterojunction devices formed of materials selected from the class of I-III-$VI_2$ chalcopyrite compounds has involved the formation of growth nodules in the selenide layer 35. In each and every instance where the photocell exhibited the presence of such growth nodules, the cells were found to have relatively low energy conversion efficiencies. Moreover, whereas high efficiency cells made in accordance with the present invention exhibited improved photoresponse characteristics following post-deposition heat treatments, those cells having growth nodules present in the selenide layer tended to rapidly degrade when exposed to subsequent heat treatments. It has been observed that the conditions necessary for nodule formation are: (i) the selenide film must be of low resistivity (i.e., less than approximately 50 KΩ/□); (ii) the selenide film must be formed of p-type material; and (iii), the selenide film must be exposed to CdS. On the other hand, nodules have not been detected in high resistivity p-type $CuInSe_2$devices, nor in n-type $CuInSe_2$ devices. It is believed that excessive copper diffusion into the CdS semiconductor layer serves to make the CdS layer a relatively high resistivity layer, thereby significantly reducing cell efficiency.

Referring to FIG. 7, there has been microphotographically illustrated at 2000×magnification a conventional $CuInSe_2$ semiconductor wherein the selenide region 35b exhibits the presence of a plurality of undesired copper growth nodules 65 even when the region 35b has been exposed only to minimal amounts of CdS. Referring to FIG. 8, the same growth nodules 65 are depicted in the junction 34 following application of the CdS layer 36. It is believed that free copper in contact with the CdS, together with the large voids which have developed, explain why cells formed with such nodules are of poor quality and further degrade with subsequent heat treatment. In order to avoid copper growth nodule formation, the tendency in the prior art has, therefore, been to deposit selenide film layers having relatively high surface resistivities which have been found not to exhibit nodule formations. With these structures, very high photocurrents have been achieved but, at quite low voltages. And, attempts to increase voltages by depositing low resistivity films have met with little success due to nodule formation.

However, when forming cells 30 in accordance with the features of the present invention wherein a relatively high resistivity n-type material (e.g., greater than $1\times10^6$Ω/□) is vacuum deposited over a moderately low resistivity p-type region (e.g., 0.5–15.0 KΩ/□), the ensuing interdiffusion (including the CdS layer) results in conversion of the n-type region 35b (FIG. 5) to high resistivity p-type material. By carefully controlling the thickness of the low resistivity p-type region, the copper deposition rate, and substrate temperature, reproducible deposits without copper growth nodule formation have been obtained, as best illustrated by reference to FIGS. 9 and 10.

Figure 11:
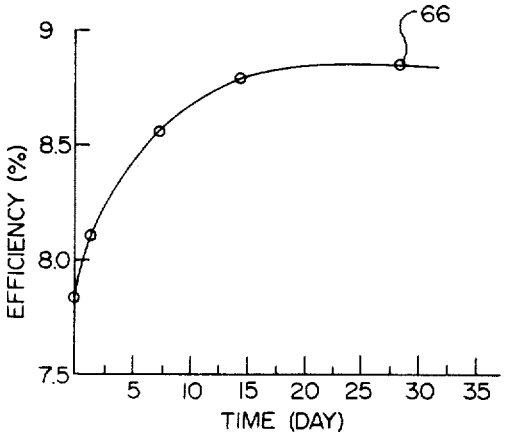
FIG. 11 is a graphic presentation illustrating efficiency of a thin-film heterojunction cell made in accordance with the present invention as a function of time following heat treatment, efficiency being illustrated on the ordinate and time (in days) on the abscissa.

Thus far we have, in the practice of the present invention, produced thin-film, p-n-type heterojunction solar cells exhibiting conversion efficiencies in excess of 9.0% and ranging up to on the order of 9.53% (percentages are here expressed as total area efficiencies as contrasted with active area efficiencies—that is, a cell having a total area efficiency of 9.53% and an exposed area of semiconductor material of only 95% exhibits an active area efficiency of approximately 10.0%). For example, a typical "as deposited" cell initially had an efficiency of about 5% with $V_{oc}$=325 mV and $J_{sc}$=31 mA/cm$^2$. Immediately after a 20 minute 200° C. heat treatment in $H_2$/Ar (probably with an air impurity as evidenced by similar results using only air), the cell performance improved to $V_{oc}$=375 mV, $J_{sc}$=34 mA/cm$^2$, n=7.83%, and F.F.=0.61. Thereafter, the cell efficiency showed continuous improvement with time. Indeed, after twenty-five days it reached a stable value of 8.72% as shown in FIG. 11 at 66. Improvement of efficiency is believed to have been mainly caused by a slowly increasing open circuit voltage and fill factor. The photovoltaic characteristics at the steady state are shown at 70 in FIG. 12, which reflects:

| | |
|---|---|
| $V_{oc}$ = 396 mV | $J_{sc}$ = 35 mA/cm$^2$ |
| n = 8.72% | F.F. = 0.64 |

Figure 12:
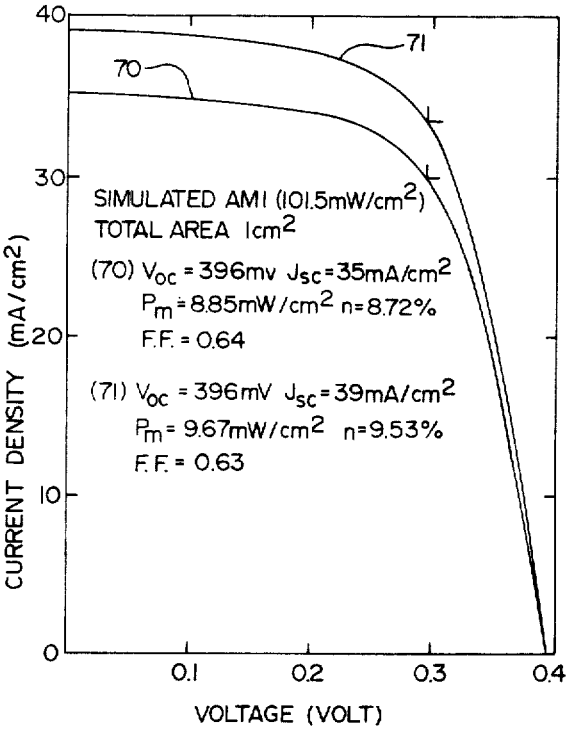
FIG. 12 is a graphic presentation of the photovoltaic characteristics of a high efficiency cell made in accordance with the present invention and subjected to simulated AM1 (101.5 $mW/cm^2$) illumination with current density (mA/cm$^2$) illustrated on the ordinate and voltage (v) illustrated on the abscissa, here depicting the photovoltaic characteristics both without an antireflection coating applied to the cell and after application of an antireflection coating to the cell.

The average total reflectance of the cell structure has been measured and found to be approximately 14%, which is mainly from the front CdS surface (n=2.2–2.3). A quarter-wavelength antireflection coating of $SiO_x$(n≅1.55) was designed for a wavelength of 0.85 μm and evaporated onto the high efficiency cell. The light I-V characteristic after application of the $SiO_x$ coating is shown in FIG. 12 by the curve 71. The short circuit current increased from 35 mA/cm$^2$ (without $SiO_x$ coating) to 39 mA/cm$^2$, or more than a 10% improvement. The total area performances of the final cell are:

| | |
|---|---|
| $V_{oc}$ = 396 mV | $J_{sc}$ = 39 mA/cm$^2$ |
| $V_{mp}$ = 293 mV | $J_{mp}$ = 33 mA/cm$^2$ |
| n = 9.53% | F.F. = 0.63 |

The foregoing measurements were made using an ELH lamp (a projector-type tungsten-halogen lamp) under simulated AM1 illumination. Excluding the 5% grid shading area resulting from the test probe, the active area efficiency was 10.15%. A similar cell from another substrate which showed an efficiency of 9.28% under the same illumination has been measured under Seattle clear day sunlight (2:15 p.m., on June 19, 1980). The measured intensity was determined to be 92.5 mW/cm$^2$ utilizing a standard silicon cell. The cell characteristics are:

| | |
|---|---|
| $V_{oc}$ = 380 mV | $J_{sc}$ = 35 mA/cm$^2$ |
| $V_{mp}$ = 280 mV | $J_{mp}$ = 30 mA/cm$^2$ |
| $P_m$ = 8.4 mW/cm$^2$ | |
| n = 9.1% | F.F. = 0.63 |

The efficiency under sunlight is less than 2% less than the measurement under the ELH lamp.

Two representative high efficiency cells respectively having efficiencies of 9.28% and 9.53% were then measured under a Xenon lamp solar simulator of NASA's Lewis Research Center. With the best available reference cell ($Cu_2S$/CdS cell with Kapton cover) whose spectral response resembles the response of cells made in accordance with the present invention, the measured photovoltaic performance was as follows:

| 9.28% Cell | 9.53% Cell |
|---|---|
| $I_{sc}$ = 39.3 mA | $I_{sc}$ = 38.8 mA |
| $V_{oc}$ = 391 mV | $V_{oc}$ = 404 mV |
| $I_{max}$ = 33.5 mA | $I_{max}$ = 298 mV |
| $V_{max}$ = 286 mV | |
| $P_{max}$ = 9.58 mW | $P_{max}$ = 9.89 mW |
| F.F. = 0.624 | F.F. = 0.630 |
| Eff. = 9.58% | Eff. = 9.89% |

Figure 13:
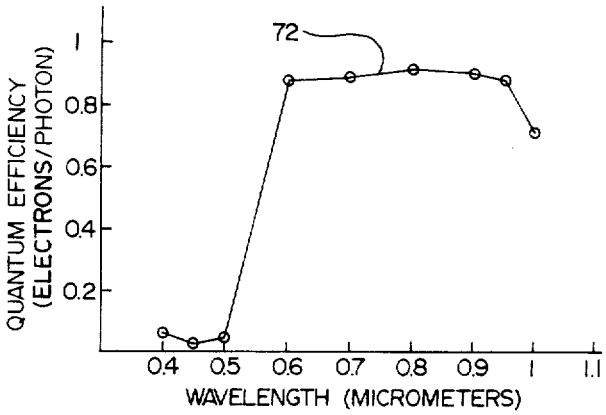
FIG. 13 is a graphic presentation illustrating the quantum efficiency as a function of wavelength for the high efficiency cell of the present invention, here depicting quantum yield (electrons/photon) on the ordinate and wave-length (micrometers) on the abscissa.

The foregoing devices exhibited spectral characteristics similar to those previously reported by Kazmerski. See, e.g., Reference No. 8, supra. As shown in FIG. 13, the quantum efficiency as a function of wavelength as measured at NASA's Lewis Research Center is fairly flat as indicated by curve 72 and its value is over 0.9, at least within the measurement range from 0.6 $\mu m \leqq \lambda \leqq 1.0$ $\mu m$.

The dark I-V characteristic of the high efficiency cell in a semilog plot is a straight line which gives the diode factor, A, 1.285 and the reverse saturation current, $J_o$, $1.8\times10^{-7}$A/cm$^2$.

Figure 14:
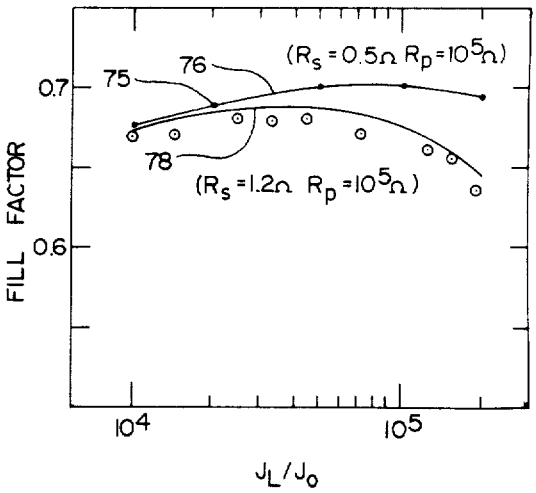
FIG. 14 is a graphic representation of the experimental and calculated values of fill factor (the ordinate) as a function of $J_L/J_o$ (the abscissa) for a high efficiency cell embodying the features of the present invention.

The response of high efficiency cells with an $SiO_x$ coating as a function of light intensity has been measured by a set of newly made neutral density filters (various thicknesses of molybdenum on glass). These filters have a nearly flat transmittance over the 0.5 $\mu m < \lambda < 2.0$ $\mu m$ in contrast to previous Kodak gelatine filters which work only in the visible range. The measured fill factor as a function of light intensity in terms of $J_L/J_o$ is shown as a series of black dots 75 defining curve 76 in FIG. 14. The intensity range is from 100 mW/cm$^2$ ($J_L/J_o = 1.94\times10^5$) down to less than 10 mW/cm$^2$ ($J_L/J_o = 10^4$). The smooth curve 78 is the calculated fill factor as a function of $J_L/J_o$ using the measured values of: $R_s = 1.2\Omega$; $R_p = 10^5\Omega$; A = 1.285; $J_o = 1.8\times10^{-7}$A/cm$^2$; and, T = 300°K—using the theory described by K. W. Mitchell, Evaluation Of The CdS/CdTe Heterojunction Solar Cell, GARLAND PUBLISHING, INC. (1979). The experimental and calculated values seem to agree very well, indicating that the fill factor is limited by the series resistance. If the series resistance could be reduced to 0.5Ω (as indicated by the upper curve 76 in FIG. 14), the fill factor could be increased to 0.69 at the AM1 condition. And, if a high 0.69 fill factor can be realized in the existing high efficiency cell (n = 9.53%), the total area efficiency can be increased to 10.59%.

It should be noted that, in contrast to previous measurements which showed increasing efficiency by reducing light intensity, measurements using the new neutral density filters show that efficiency decreases with the decreasing light intensity.

It is further believed that additional increases in efficiency can be readily attained by increasing the optical transparency of the contact grid 38, 39. Thus, by reducing the number of electrode grid lines 38 from ten lines per centimeter to five lines per centimeter, and by moving the collector electrode to the edge of the cell (as indicated in FIG. 1)—in the high efficiency solar cells tested and reported on herein, such collector electrode was disposed in the center of the cell and, consequently, measurements utilizing probes tended to shadow the cell and reduced the amount of light—it is expected that a 4% to 8% improvement in device efficiency will be attained.

Thus far, the present invention has been described in connection with a typical laboratory-type experimental system of the type shown in FIG. 6 for forming small area, thin-film, p-n-type, heterojunction devices readily adaptable for formation by known low cost, large area fabrication techniques for applying film coatings to low cost, large area substrates. As an interim step in converting such an experimental system to a continuous in-line production system, a planetary-type deposition fixture (not shown) might be employed wherein the substrates are mounted in planets which rotate about the planet axis and about the system axis. Such a conventional planetary system eliminates problems of deposition nonuniformities and enables use of parallel boats for the copper and indium sources, or a conventional electron gun system (not shown) employing separate pockets for the copper and indium sources.

Figure 15:
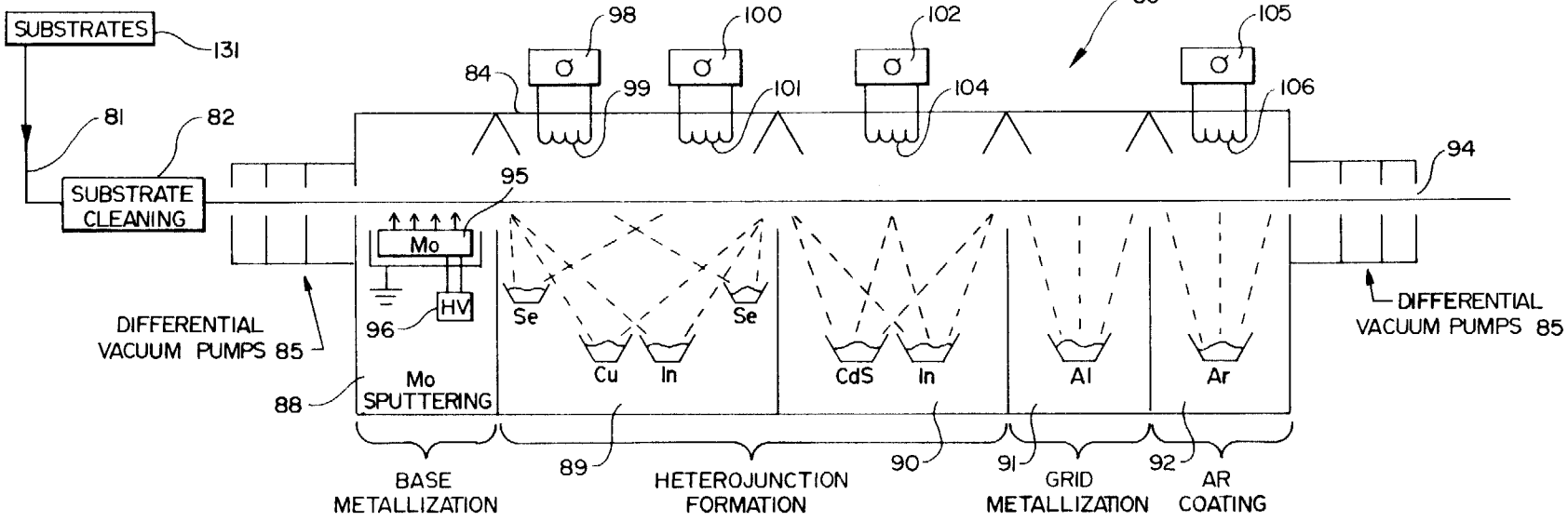
FIG. 15 is a highly diagrammatic elevational block-and-line diagram illustrating an exemplary continuous in-line production system for forming $CdS/CuInSe_2$ heterojunction, thin-film, large area solar cells in accordance with the present invention and, FIG. 16 is a fragmentary, highly diagrammatic sectional view of a modified thin-film cell similar to the form of the invention depicted in FIG. 2, but here comprising an n-p-type heterojunction embodying features of the present invention as contrasted with the p-n-type heterojunction shown by way of example in FIG. 2.

However, in its broader aspects, the present invention provides for formation of novel "graded-composition" heterojunctions 34 (FIG. 5) formed of materials selected from the class of I-III-$VI_2$ chalcopyrite compounds and CdS (or other suitable II-VI compounds) using novel process steps which readily permit of application of the process to a continuous in-line system of the type generally indicated diagrammatically at 80 in FIG. 15. In this type of system, substrates 131 are continuously fed along a suitable conveyor system, indicated diagrammatically at 81, through a substrate cleaning station 82. As the substrates exit the cleaning station 82, they enter a continuous in-line vacuum chamber 84 having differential vacuum pumps generally indicated at 85 and sequentially presented process areas 88-92, with the substrates ultimately exiting from the vacuum chamber 84 at 94.

Process area 88 comprises a vacuum chamber preferably controlled at temperatures and pressure conditions suitable for application of a molybdenum or similar base contact material to the substrate by conventional sputtering or vacuum deposition techniques. In the exemplary system 80 of FIG. 15, the Mo contact is applied by using a Mo target 95 coupled to a suitable high voltage source 96 in a conventional manner well known to those skilled in the art.

Process area 89 is preferably maintained at a temperature on the order of at least 350° and ranging to 450° by means of an adjustable temperature control 98 and heating coil 99 so as to permit vacuum deposition of $CuInSe_2$ on the substrates as they transit through vacuum chamber 84. A second adjustable heat control 100 and heating coil 101 may be provided at the downstream end of zone 89 for raising the substrate temperature to about 450° C.±25° C., but less than 500° C., after about 75% of the $CuInSe_2$ layer has been deposited. A suitable EIES controller or the like (not shown in FIG. 15) would be provided for monitoring and adjusting the copper/indium ratio in the manner previously described. As previously indicated, the pressure in area 89 of chamber 84 is preferably maintained at about $3\text{-}8\times10^{-6}$ torr.

As the substrates successively pass through process areas 90, 91 and 92, the low resistivity CdS (or other suitable II-VI materials having band gap energies greater than 1.5 ev) semiconductor layer 36, aluminum contact grid 38, 39, and $SiO_x$ layer 40 (Cf., FIG. 5) are sequentially applied thereto. To this end, a temperature control 102 and heating coil 104 are provided for establishing a controlled temperature level in process area 90 ranging from about 150° C. to about 250° C.; while a similar adjustable control 105 and coil 106 are provided in process area 92 for maintaining the temperature in a range of about 100° C. to about 125° C. Aluminum is preferably evaporated in process area 91 at ambient temperature and at a pressure less than $5\times10^{-6}$ torr; while CdS is preferably evaporated in process area 90 at a pressure of less than $2\times10^{-5}$ torr. Finally, $SiO_x$ is deposited in process area 92 at a deposition rate and oxygen pressure adjusted to yield $n\cong1.55$.

Thus, those persons skilled in the art will appreciate that there has herein been provided a system which readily permits application of materials selected from the class of I-III-$VI_2$ chalcopyrite compounds to a substrate to form a semiconductor layer having a composition gradients therein, with the first semiconductor region applied to the substrate being copper-enriched and having a relatively low resistivity—viz., on the order of 0.5 to 15 KΩ/□—in the form of a p-type material; and, thereafter, a second region of the same elemental composition but, with a decreased copper/indium ratio—i.e., the material is copper-deficient—is deposited on the first low resistivity region to form a relatively high resistivity (viz., on the order of greater than $1\times10^6\Omega/\square$) transient n-type region. As a consequence of this arrangement, when the CdS semiconductor film is vacuum deposited on the "composition-graded" chalcopyrite materials (which then define a transient p-n-type homojunction), copper growth nodules are precluded from forming and the transient n-type region of the chalcopyrite semiconductor gradually evolves to a high resistivity p-type region through interdiffusion processes, thereby resulting in thin-film heterojunction devices having energy conversion efficiencies which closely approximate 10%, or greater.

As previously indicated, the present invention finds particularly advantageous use in the formation of p-n-type heterojunctions for use in solar cells where the requisite band gap energy level for the p-type material falls in the range of 1-1.5 ev. However, since some n-type materials in the class of I-III-$VI_2$ chalcopyrite compounds fall within that range—for example, $AgInSe_2$ having a band gap energy level of 1.24 ev—it will be apparent that the present invention is not limited to the formation of p-n-type heterojunctions. Moreover, some of the I-III-$VI_2$ chalcopyrite compounds such, for example, as $CuInSe_2$ can be grown as both n-type and p-type crystals. This, therefore, permits the method of the present invention to also be used to form n-p-type heterojunctions.

Figure 16:
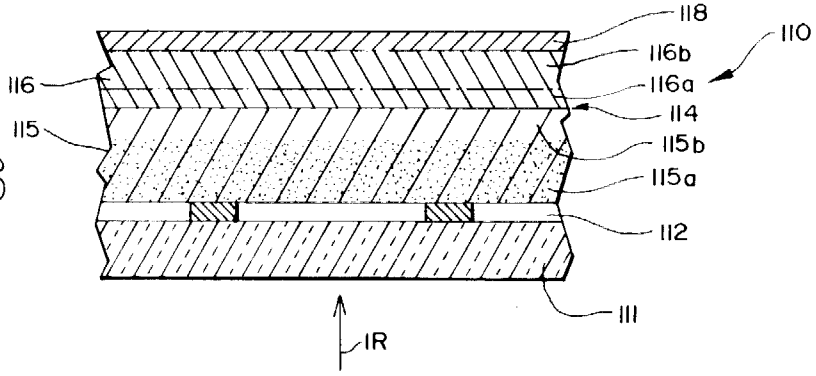

For example, there has been diagrammatically illustrated in FIG. 16 a typical n-p-type heterojunction which, like the p-n-type heterojunction previously described, is here preferably formed from CdS and $CuInSe_2$. As here shown, the exemplary device 110 is provided with a substrate 111 preferably formed of glass, ITO (indium tin oxide) or similar light transmissive material so as to permit incident radiation to pass therethrough and into the photoactive region of the cell 110, as indicated by the arrow IR. A suitable base contact 112 is applied directly to the substrate 111 and, since such contact must be light transparent, it is preferably formed in a grid-like pattern or, of indium or the like. Thereafter, a first semiconductor layer 115 of, for example, CdS is applied to the contact 112, and a composition graded layer of photoactive material 116 such, for example, as $CuInSe_2$, is applied to layer 115 to form the desired n-p heterojunction 114. In keeping with the invention, the n-type layer of CdS (or other suitable II-VI type material having a band gap energy greater than 1.5 ev) includes a first indium-doped region 115a in contact with the base contact 112, and a second superimposed region 115b of pure CdS. Similarly, the layer 116 comprises composition graded regions of I-III-$VI_2$ type ternary material such, for example, as $CuInSe_2$, wherein the lower region 116a comprises a high resistivity transient n-type region of copper-deficient $CuInSe_2$, and the upper region 116b comprises a low resistivity p-type region of copper-enriched $CuInSe_2$. Finally, an upper contact 118 is formed on region 116b to complete the transducer 110.

In general, the various layers of the cell 110 indicated by way of example in FIG. 16 can be applied in a manner similar to that previously described; except, that the temperature level for applying the composition graded layer 116 of photoactive material is preferably maintained at less than 250° since this layer is deposited on the CdS layer 115. Additionally, the substrate 111 and base contact must be light transparent as indicated above. This type of cell has one advantage over the p-n junction previously described in that the glass substrate 111 or the like serves to protect the cell; whereas cells such as that shown in FIGS. 2 and 5 are preferably, but not necessarily, provided with some type of additional protection such, for example, as glass encapsulation or the like.

Thus, it will be evident to those skilled in the art that the present invention permits the formation of both p-n-type heterojunction and n-p-type heterojunctions which are formed by a process in which, preferably, a I-III-$VI_2$ type photoactive material is deposited by simultaneous elemental evaporation to initially form a first semiconductor layer defining a transient homojunction which subsequently evolves into a composition graded photoactive semiconductor layer having a low resistivity region and a high resistivity region with the latter sandwiched between the low resistivity region and a second semiconductor layer of II-VI type semiconductor material. Consequently, since the thin-film heterojunction may be formed as either a p-n-type device or an n-p-type device, such heterojunctions are referred to herein and in certain of the appended claims as an "A-B-type" heterojunction wherein the "A" and "B" layers of the heterojunction formed are selected from one of the following four combinations of A/B semiconductor materials:

| A | and | B |
|---|---|---|
| (i) a p-type ternary material | and | an n-type material; |
| (ii) an n-type ternary material | and | a p-type material; |
| (iii) an n-type material | and | a p-type ternary material; |
| (iv) a p-type material | and | an n-type ternary material. |

It will further be understood by those skilled in the art that the invention is not limited to ternary type materials and that other materials may also be suitable. For example, it is believed that a quaternary material such as $CuIn_{1-x}Ga_xSe_2$ or $CuIn_{1-x}Ga_xS_2$ could be used. Thus, the term "ternary" as used herein and in the appended claims is not used in a limiting sense, but only in the sense that the compound from which the photoactive region of the cell is formed must have at least three constituent elements including at least two elements selected from the class of I-III elements such, for example, as copper and indium, and at least one element selected from a class VI material such as Se or S. Similarly, while excellent results have been obtained utilizing CdS as the n-type material—a material having a band gap energy of 2.4 ev—other materials could be used such, for example, as $Cd_{1-x}Zn_xS$ having a band gap energy greater than 2.4 or $CdS_{1-x}Se_x$ having a band gap energy greater than 2 ev. Thus, it is evident that the n-type material is preferably selected from the class of II-VI elements having suitable wide gap energies on the order of greater than 1.5 ev.

It is to be further understood that the phrase "simultaneous elemental evaporation" as used herein and in the appended claims means the simultaneous evaporation of the three constituent elements from various types of sources such, for example, as: (i) a compound ternary source of $CuInSe_2$; or (ii), two separate sources such as $Cu_2Se$ and $In_3Se_3$; or (iii), three separate sources such as $Cu_2Se$, In and Se; etc. Other possibilities also exist as will be recognized by those skilled in the art.

Finally, those skilled in the art will appreciate that the references herein and in the appended claims to "composition graded" regions of photovoltaic semiconductor materials is intended to embrace those regions of a transient homojunction resulting from alteration of the ratio of the metallic elements selected from the class of I-III materials in a ternary or quaternary compound or the like. For example, where one desires to form a p-type region, such result can be achieved by providing an evaporant stream that either contains an excess of a type I element or a deficiency of a type III element; and, where one wishes to obtain a transient n-type material, such result can be obtained by evaporating a stream that is deficient in a type I element or enriched with a type III element.

What is claimed is:

1. In a method of forming a photovoltaic light-to-electrical energy transducer of the type including a thin-film A-B-type heterojunction where "A" and "B" are selected from the group of semiconductor materials consisting of:

| A | and | B |
|---|---|---|
| (i) a p-type ternary material | and | an n-type material; |
| (ii) an n-type ternary material | and | a p-type material; |
| (iii) an n-type material | and | a p-type ternary material; |
| (iv) a p-type material | and | an n-type ternary material; |

and wherein the transducer includes a substrate, a first contact deposited on the substrate, a first semiconductor layer formed of A-type material deposited on the first contact, a second semiconductor layer formed of B-type material deposited on the first semiconductor layer and defining therewith the thin-film A-B-type heterojunction, and a second contact deposited on the second semiconductor layer, the improvement comprising a method wherein:

(a) the one of the first and second semiconductor layers formed of a ternary semiconductor material is formed by simultaneous elemental evaporation of the ternary semiconductor material to form a semiconductor layer having two composition graded regions sequentially formed one upon the other with one region having a first preselected ratio of two of the elements in the ternary semiconductor material so as to form a low resistivity semiconductor region and the other of the regions having a different preselected ratio of the same two elements so as to form a high resistivity transient semiconduction region and with the two regions defining a transient homojunction; and (b) the other of the first and second semiconductor layers is formed by deposition of a semiconductor material in face-to-face contact with respect to the high resistivity transient semiconductor region of the transient homojunction so as to permit the high resistivity transient semiconductor region to evolve through elemental interdiffusion into a region of relatively high resistivity semiconductor material of the same type as the low resistivity region formed in step (a) to thereby form a thin-film A-B type heterojunction photovoltaic light-to-electrical energy transducer.

2. The method of forming a photovoltaic light-to-electrical energy transducer including a thin-film A-B-type heterojunction as set forth in claim 1 wherein the A-B-type heterojunction is a p-n-type heterojunction and the one semiconductor layer defining the transient homojunction defines a transient p-n-type homojunction having a region of low resistivity p-type material and a region of high resistivity transient n-type material, and the other semiconductor layer is formed of n-type semiconductor material deposited in face-to-face contact with the region of high resistivity transient n-type material.

3. The method of forming a photovoltaic light-to-electrical energy transducer including a thin-film A-B-type heterojunction as set forth in claim 1 wherein the A-B-type heterojunction is an n-p-type heterojunction and the one semiconductor layer defining the transient homojunction defines a transient n-p type homojunction having a region of high resistivity transient n-type material and a region of low resistivity p-type material, and the other semiconductor layer is formed of n-type semiconductor material deposited in face-to-face contact with the region of high resistivity transient n-type material.

4. The method of forming a photovoltaic light-to-electrical energy transducer including a thin-film A-B-type heterojunction as set forth in claim 1 wherein the ternary material is selected from the group of I-III-$VI_2$ chalcopyrite compounds.

5. The method of forming a photovoltaic light-to-electrical energy transducer including a thin-film A-B-type heterojunction as set forth in claim 1 wherein the ternary material is selected from the group of I-III-$VI_2$ chalcopyrite compounds and the other of the first and second semiconductor layers is formed of materials selected from the group of II-VI elements.

6. The method of forming a photovoltaic light-to electrical energy transducer including a thin-film A-B-type heterojunction as set forth in claims 4 or 5 wherein the ternary material has a band gap energy in the range of 1-1.5 ev.

7. The method of forming a photovoltaic light-to-electrical energy transducer including a thin-film A-B-type heterojunction as set forth in claims 4 or 5 wherein the ternary material has a band gap energy in the range of 1-1.5 ev and the other of the first and second semiconductor layers is formed of materials having a band gap energy greater than 1.5 ev.

8. The method of forming a photovoltaic light-to-electrical energy transducer including a thin-film A-B-type heterojunction as set forth in claims 1, 2 or 3 wherein the ternary semiconductor material is $CuInSe_2$.

9. The method of forming a photovoltaic light-to-electrical energy transducer including a thin-film A-B-type heterojunction as set forth in claims 1, 2 or 3 wherein the other of the first and second semiconductor layers has a band gap energy greater than 1.5 ev.

10. The method of forming a photovoltaic light-to-electrical energy transducer including a thin-film A-B-type heterojunction as set forth in claims 1, 2 or 3 wherein the other of the first and second semiconductor layers is selected from the group consisting of CdS;

$Cd_{1-x}Zn_xS$; and, $CdS_{1-x}Se_x$.

11. The method of forming a photovoltaic light-to-electrical energy transducer including a thin-film A-B-type heterojunction as set forth in claims 1, 2 or 3 wherein the ternary semiconductor material is $CuInSe_2$ and the other of the first and second semiconductor layers is selected from the group consisting of:

CdS;

$Cd_{1-x}Zn_xS$; and, $CdS_{1-x}Se_x$.

12. The method of forming a photovoltaic light-to-electrical energy transducer including a thin-film A-B-type heterojunction as set forth in claims 1, 2, or 3 wherein the ternary semiconductor material is $CuInSe_2$ and the other of the first and second semiconductor layers is CdS.

13. The method of forming a photovoltaic light-to-electrical energy transducer including a thin-film A-B-type heterojunction as set forth in claims 1, 2 or 3 wherein the ternary semiconductor material is a I-III-$VI_2$ chalcopyrite compound and the ratio of the I-III elements is adjusted during one portion only of simultaneous elemental evaporation of the ternary compound so as to form one of the low resistivity and transient high resistivity regions of the transient homojunction, and adjusted to a different I-III ratio during the remaining portion of simultaneous elemental evaporation of the ternary compound so as to form the other of the low resistivity and the transient high resistivity regions of the transient homojunction.

14. The method of forming a photovoltaic light-to-electrical energy transducer including the thin-film A-B-type heterojunction as set forth in claims 1 or 2 wherein the ternary semiconductor layer is $CuInSe_2$ and the copper/indium ratio is initially adjusted to form a slightly copper-enriched region during simultaneous elemental evaporation of the $CuInSe_2$ to form the low resistivity region of the transducer of p-type material, and is readjusted to form a slightly copper-deficient region during simultaneous elemental evaporation of the $CuInSe_2$ to form the high resistivity transient semiconductor region of the transducer of transient n-type material.

15. The product produced by the method set forth in claims 1, 2, 3, 4 or 5.

16. In a photovoltaic light-to-electrical energy transducer of the type including a thin-film A-B-type heterojunction where "A" and "B" are selected from the group of semiconductor materials consisting of:

| A | and | B |
|---|---|---|
| (i) a p-type ternary material | and | an n-type material; |
| (ii) an n-type ternary material | and | a p-type material; |
| (iii) an n-type material | and | a p-type ternary material; |
| (iv) a p-type material | and | an n-type ternary material; |

and wherein the transducer includes a substrate, a first contact deposited on said substrate, a first semiconductor layer formed of A-type material deposited on said first contact, a second semiconductor layer formed of B-type material deposited on said first semiconductor layer and defining therewith the thin-film A-B-type heterojunction, and a second contact deposited on said second semiconductor layer, the improvement comprising:

(a) the one of said first and second semiconductor layers formed of a ternary semiconductor material comprising a semiconductor layer having been formed with two composition graded regions with one region superimposed on the other and with one region having a first preselected ratio of two of the elements in said ternary semiconductor material so as to form a low resistivity semiconductor region and the other of said regions having a different preselected ratio of the same two elements and having been formed as a high resistivity transient semiconductor region and with said two regions having been formed as a transient homojunction; and, (b) the other of said first and second semiconductor layers having been formed in face-to-face contact with said high resistivity transient semiconductor region of said transient homojunction so as to permit said high resistivity transient semiconductor region to evolve through elemental interdiffusion into a region of relatively high resistivity semiconductor material of the same type as said low resistivity region to thereby form a thin-film A-B-type heterojunction photovoltaic light-to-electrical energy transducer.

17. The photovoltaic light-to-electrical energy transducer set forth in claim 16 and including a thin-film A-B-type heterojunction wherein said A-B-type heterojunction is a p-n-type heterojunction and said one semiconductor layer defining said transient homojunction having been formed as a transient p-n-type homojunction having a region of low resistivity p-type material and a region of high resistivity transient n-type material, and said other semiconductor layer is formed of n-type semiconductor material deposited in face-to-face contact with said region of high resistivity transient n-type material.

18. The photovoltaic light-to-electrical energy transducer set forth in claim 16 and including a thin-film A-B-type heterojunction wherein said A-B-type heterojunction is an n-p-type heterojunction and said one semiconductor layer defining said transient homojunction having been formed as a transient n-p type homojunction having a region of high resistivity transient n-type material and a region of low resistivity p-type material, and said other semiconductor layer is formed of n-type semiconductor material deposited in face-to-face contact with said region of high resistivity transient n-type material.

19. The photovoltaic light-to-electrical energy transducer as set forth in claim 16 and including a thin-film A-B-type heterojunction wherein said ternary material is selected from the group of I-III-$VI_2$ chalcopyrite compounds.

20. The photovoltaic light-to-electrical energy transducer as set forth in claim 16 and including a thin-film A-B-type heterojunction wherein said ternary material is selected from the group of I-III-$VI_2$ chalcopyrite compounds and said other of said first and second semiconductor layers is formed of materials selected from the group of II-VI elements.

21. The photovoltaic light-to-electrical energy transducer as set forth in claims 19 or 20 and including a thin-film A-B-type heterojunction wherein said ternary material has a band gap energy in the range of 1–1.5 ev.

22. The photovoltaic light-to-electrical energy transducer as set forth in claims 19 or 20 and including a thin film A-B-type heterojunction wherein said ternary material has a band gap energy in the range of 1–1.5 ev and said other of said first and second semiconductor layers is formed of materials having a band gap energy greater than 1.5 ev.

23. The photovoltaic light-to-electrical energy transducer as set forth in claims 16, 17 or 18 and including a thin-film A-B-type heterojunction wherein said ternary semiconductor material is $CuInSe_2$.

24. The photovoltaic light-to-electrical energy transducer as set forth in claims 16, 17 or 18 and including a thin-film A-B-type heterojunction wherein said other of said first and second semiconductor layers has a band gap energy greater than 1.5 ev.

25. The photovoltaic light-to-electrical energy transducer as set forth in claims 16, 17 or 18 and including a thin-film A-B-type heterojunction wherein said other of said first and second semiconductor layers is selected from the group consisting of:

CdS;

$Cd_{1-x}Zn_xS$; and, $CdS_{1-x}Se_x$.

26. The photovoltaic light-to-electrical energy transducer as set forth in claims 16, 17 or 18 and including a thin-film A-B-type heterojunction wherein said ternary semiconductor material is $CuInSe_2$ and said other of said first and second semiconductor layers is selected from the group consisting of:

CdS;

$Cd_{1-x}Zn_xS$; and, $CdS_{1-x}Se_x$.

27. The photovoltaic light-to-electrical energy transducer as set forth in claims 16, 17 or 18 and including a thin-film A-B-type heterojunction wherein said ternary semiconductor material is $CuInSe_2$ and said other of said first and second semiconductor layers in CdS.

28. The method of forming a p-n-type heterojunction photovoltaic device comprising the steps of:

(a) depositing a first region of relatively low resistivity p-type material on a metallized substrate;

(b) depositing a second region of relatively high resistivity transient n-type material formed of the same elemental constituents as the relatively low resistivity p-type material deposited in step (a) with such transient n-type material being deposited on the first region of p-type material and defining therewith a transient p-n-type homojunction; and, (c) depositing a film of low resistivity n-type semiconductor material on the transient p-n-type homojunction formed in steps (a) and (b), whereupon interdiffusion of the constituent elements of the materials employed in steps (a), (b) and (c) between the p-type matrial and the transient n-type material, and between the transient n-type material and the n-type semiconductor material, causes the transient n-type material to evolve into relatively high resistivity p-type material so as to form a thin-film heterojunction essentially devoid of growth nodules and permitting a photovoltaic response characteristic of energy transducers capable of exhibiting relatively high conversion efficiencies at least approximating 10.0%.

29. The method of claim 28 wherein the first and second regions of p-type and transient n-type material, respectively, comprise a ternary semiconductor material formed by simultaneous elemental evaporation.

30. The method of claim 29 wherein the ternary semiconductor material is a chalcopyrite compound.

31. The method of claim 29 wherein the ternary semiconductor material is a material selected from the class of I-III-$VI_2$ chalcopyrite compounds.

32. The method of claim 29 wherein the ternary semiconductor material is $CuInSe_2$.

33. The method of claim 32 wherein the copper/indium ratio in the ternary semiconductor material is initially adjusted to form a slightly copper-enriched region during simultaneous elemental evaporation thereof to form the first region of relatively low resistivity p-type material in step (a) and is readjusted during such simultaneous elemental evaporation to form a slightly copper-deficient ternary compound during evaporation of the second region of relatively high resistivity transient n-type material formed in step (b).

34. The method of claim 32 wherein the copper/indium ratio is altered upon formation of at least about 50% of the total desired thickness of the transient p-n-type homojunction but prior to formation of about 66.7% of the total desired thickness of the transient p-n-type homojunction.

35. The method of claim 32 wherein the film of low resistivity n-type semiconductor material is formed of n-type material having a band gap energy greater than 1.5 ev.

36. The method of claim 35 wherein the n-type low resistivity semiconductor material is a II-VI material.

37. The method of claim 36 wherein the II-VI material is selected from the group consisting of:

CdS;

$Cd_{1-x}Zn_xS$; and, $CdS_{1-x}Se_x$.

38. The method of claim 36 wherein the II-VI material is CdS.

39. The method of claim 28 wherein the film of low-resistivity n-type semiconductor material comprises a first region of relatively pure CdS and a second superimposed region of indium-doped CdS.

40. The method of claim 28 wherein the first and second regions of semiconductor material formed in steps (a) and (b) are formed at a temperature in the range of 350° C. to 500° C.

41. The method of claim 28 wherein the first region of semiconductor material formed in step (a) and a portion of the second region of semiconductor material formed in step (b) are formed at a temperature in the range of 350° C. to a temperature less than 450° C., and the remainder of the second region of semiconductor material formed in step (b) is formed at a temperature in the range of about 450° to 500° C.

42. The method of claim 28 wherein the first region of semiconductor material formed in step (a) and a portion of the second region of semiconductor material formed in step (b) are formed at a temperature on the order of 350° C., and the remainder of the second region of semiconductor material formed in step (b) is formed at a temperature on the order of 450° C.±approximately 25° C.

43. The method of claim 28 wherein the film of low resistivity n-type semiconductor material formed in step (c) is formed at a temperature in the range of 150° C. to 200° C.

44. The method of claims 40, 41 or 42 wherein the film of low resistivity n-type semiconductor material formed in step (c) is formed at a temperature in the range of 150° C. to 200° C.

45. The method of claims 28, 30, 31, 32, 40, 41 or 42 wherein the first and second regions of semiconductor material formed in steps (a) and (b) are formed in an atmosphere maintained at $3\text{-}8\times10^{-6}$ torr.

46. The method of claims 28, 29, 30, 31 or 32 wherein a grid-like contact is formed on the film of low resistivity n-type semiconductor material deposited in step (c) and an antireflective coating is formed on the grid-like contact and the exposed surface of the film of low resistivity n-type semiconductor material.

47. The method of claims 28, 29, 30, 31 or 32 wherein a grid-like contact is formed on the film of low resistivity n-type semiconductor material deposited in step (c) and an antireflectivecoating formed of $SiO_x$ is formed on the grid-like contact and the exposed surface of the film of low resistivity n-type semiconductor material.

48. The method of claims 28, 29, 30, 31 or 32 wherein a grid-like contact is formed on the film of low resistivity n-type semiconductor material deposited in step (c) and an antireflective coating formed of $SiO_x$ wherein "x" is on the order of "1.8" is formed on the grid-like contact and the exposed surface of the film of low resistivity n-type semiconductor material.

49. The product produced by the method set forth in claims 28, 29, 30, 31, 32, 40, 41, 42 or 43.

50. In a method of forming a photovoltaic light-to-electrical energy transducer of the type comprising a thin-film p-n-type heterojunction including a metallized substrate, a first semiconductor layer formed of p-type semiconductor material and deposited on the metallized substrate, a second semiconductor layer formed of low resistivity n-type semiconductor material formed on the first semiconductor layer, and a grid-like upper contact formed on the second semiconductor layer, the improvement comprising a method wherein:

(a) the first semiconductor layer of a ternary semiconductor material is formed by simultaneous elemental evaporation to form a first region of low resistivity p-type semiconductor material on the metallized substrate; and, (b) while the ternary material is undergoing simultaneous elemental evaporation the ratio of two of the elemental constituents being evaporated is adjusted so as to form a second region of relatively high resistivity transient n-type semiconductor material on the first region of low resistivity p-type material, thereby forming a transient p-n-type homojunction on the metallized substrate; and, wherein upon formation of the second semiconductor layer of n-type material on the transient p-n homojunction, the second region of relatively high resistivity transient n-type semiconductor material is sandwiched between the first region of low resistivity p-type material and the second semiconductor layer of low resistivity n-type material so as to permit the transient n-type region to evolve through elemental interdiffusion into a region of relatively high resistivity p-type material to thereby form a thin-film p-n-type heterojunction photovoltaic light-to electrical energy transducer.

51. The method of claim 50 wherein the first and second regions of p-type and transient n-type material are formed by simultaneous elemental evaporation of a ternary semiconductor material.

52. The method of claim 51 wherein the ternary semiconductor material is a chalcopyrite compound.

53. The method of claim 51 wherein the ternary semiconductor material is a material selected from the class of $I\text{-}III\text{-}VI_2$ chalcopyrite compounds.

54. The method of claim 51 wherein the ternary semiconductor material is $CuInSe_2$.

55. The method of claim 54 wherein the copper/indium ratio in the ternary semiconductor material is initially adjusted to form a slightly copper-enriched region during simultaneous elemental evaporation thereof to form the first region of relatively low resistivity p-type material in step (a) and is readjusted during such simultaneous elemental evaporation to form a slightly copper-deficient ternary compound during evaporation of the second region of relatively high resistivity transient n-type material formed in step (b).

56. The method of claim 54 wherein the copper/indium ratio is readjusted upon formation of at least about 50% of the total desired thickness of the transient p-n-type homojunction but prior to formation of about 66.7% of the total desired thickness of the transient p-n-type homojunction.

57. The method of claim 54 wherein the second semiconductor layer of low resistivity n-type semiconductor material in CdS.

58. The method of claim 57 wherein the layer of low-resistivity n-type semiconductor material comprises a first region of relatively pure CdS and a second superimposed region of indium-doped CdS.

59. The method of claim 57 wherein the first and second regions of semiconductor material formed in steps (a) and (b) are formed at a temperature in the range of 350° C. to 500° C.

60. The method of claim 57 wherein the first region of semiconductor material formed in step (a) and a portion of the second region of semiconductor material formed in step (b) are formed at a temperature in the range of 350° C. to a temperature less than 450° C., and the remainder of the second region of semiconductor material formed in step (b) is formed at a temperature in the range of about 450° to 500° C.

61. The method of claim 57 wherein the first region of semiconductor material formed in step (a) and a portion of the second region of semiconductor material formed in step (b) are formed at a temperature on the order of 350° C., and the remainder of the second region of semiconductor material formed in step (b) is formed at a temperature on the order of 450° C.±approximately 25° C.

62. The method of claim 57 wherein the layer of low resistivity n-type semiconductor material is formed at a temperature in the range of 150° C. to 200° C.

63. The method of claims 59, 60 or 61 wherein the layer of low resistivity n-type semiconductor material is formed at a temperature in the range of 150° C. to 200° C.

64. The method of claims 50, 54, 55 or 57 wherein the first and second regions of semiconductor material formed in steps (a) and (b) are formed in an atmosphere maintained at $3\text{–}8\times10^{-6}$ torr.

65. The method of claims 50, 54, 55 or 57 wherein an antireflective coating is formed on the grid-like contact and the exposed surface of the second semiconductor layer.

66. The method of claims 50, 54, 55 or 57 wherein an antireflective coating formed of $SiO_x$ is formed on the grid-like contact and the exposed surface of the second semiconductor layer.

67. The method of claims 50, 54, 55 or 57 wherein an antireflective coating formed of $SiO_x$ wherein "x" is on the order of "1.8" is formed on the grid-like contact and the exposed surface of the semiconductor layer.

68. The product produced by the method set forth in claims 50, 54, 55 or 57.

69. A p-n-type heterojunction photovoltaic device comprising, in combination: a metallized substrate; a first relatively thin-film region of relatively low resistivity p-type material adhered to said metallized substrate; a second relatively thin-film region formed of the same elemental constituents as said relatively low resistivity p-type material and having been formed as a relatively high resistivity transient n-type material region with said relatively low resistivity p-type material and said relatively high resistivity transient n-type material region having been formed as a composite transient p-n-type homojunction semiconductor layer; and, a relatively thin film of low resistivity n-type semiconductor material having been deposited on said transient p-n homojunction whereupon interdiffusion of the constituent elements of the materials defining said p-type region, said transient n-type region and said n-type semiconductor material between the p-type material and the transient n-type material, and between the transient n-type material and the n-type semiconductor material causes the transient n-type material to evolve into relatively high resistivity p-type material so as to form a thin-film heterojunction essentially devoid of growth nodules and permitting a photovoltaic response characteristic of energy transducers capable of exhibiting conversion efficiencies at least approximating 10.0%.

70. The device of claim 69 wherein said first and second regions of p-type and transient n-type material comprise a ternary semiconductor material.

71. The device of claim 70 wherein said ternary semiconductor material is a chalcopyrite compound.

72. The device of claim 70 wherein said ternary semiconductor material comprises a material selected from the class of I-III-$VI_2$ chalcopyrite compounds.

73. The device of claim 70 wherein said ternary semiconductor material is $CuInSe_2$.

74. The device of claim 73 wherein the copper/indium ratio in said first region of said ternary semiconductor material is such as to form a slightly copper-enriched first region of relatively low resistivity p-type material and the copper/indium ratio in said second region of said ternary semiconductor material is such as to form a slightly copper-deficient second region of relatively high resistivity transient n-type material.

75. The device of claim 74 wherein said first region of p-type material comprises between about 50% and about 66.7% of the total desired thickness of said transient p-n-type homojunction.

76. The device of claim 74 wherein said film of low resistivity n-type semiconductor material is CdS.

77. The device of claim 74 wherein said film of low-resistivity n-type semiconductor material comprises a first region of relatively pure CdS and a second superimposed region of indium-doped CdS.

78. The device of claim 69 wherein a grid-like contact is formed on the surface of said thin film of low resistivity n-type semiconductor material.

79. The device of claim 78 wherein an antireflective coating is formed on said grid-like contact and on the exposed surface of said thin film of low resistivity n-type semiconductor material.

80. The device of claim 79 wherein said antireflective coating comprises $SiO_x$ wherein "x" is on the order of "1.8".

81. In a photovoltaic light-to-electrical energy transducer of the type comprising a thin-film p-n-type heterojunction including a metalized substrate, a first semiconductor layer formed of p-type semiconductor material deposited on said metallized substrate, a second semiconductor layer formed of low resistivity n-type semiconductor material formed on said first semiconductor layer, and a grid-like upper contact formed on said second semiconductor layer, the improvement wherein:

said first semiconductor layer includes a first region of low resistivity, p-type semiconductor material formed on said metallized substrate; and a second region having been formed as a relatively high resistivity transient n-type semiconductor material region formed on said first region of p-type material with said first and second regions having been formed as a transient p-n-type homojunction formed on said metallized substrate with said transient n-type semiconductor region sandwiched between said low resistivity region of p-type semiconductor material and said second semiconductor layer formed of low resistivity n-type material so as to permit said transient n-type region to evolve through elemental interdiffusion into a region of relatively high resistivity p-type material so as to form a thin-film, p-n-type heterojunction photovoltaic light-to-electrical energy transducer.

82. The transducer of claim 81 wherein said first and second regions of p-type and transient n-type material comprise a ternary semiconductor material.

83. The transducer of claim 82 wherein said ternary semiconductor material is a chalcopyrite compound.

84. The transducer of claim 82 wherein said ternary semiconductor material comprises a material selected from the class of I-III-$VI_2$ chalcopyrite compounds.

85. The transducer of claim 82 wherein said ternary semiconductor material is $CuInSe_2$.

86. The transducer of claim 85 wherein the copper-/indium ratio in said first region of said ternary semiconductor material is such as to form a slightly copper-enriched first region of relatively low resistivity p-type material and the copper/indium ratio in said second region of said ternary semiconductor material is such as to form a slightly copper-deficient second region of relatively high resistivity transient n-type material.

87. The transducer of claim 86 wherein said first region of p-type material comprises between about 50% and about 66.7% of the total desired thickness of said transient p-n-type homojunction.

88. The transducer of claim 86 wherein said second semiconductor layer formed of low resistivity n-type semiconductor material is CdS.

89. The transducer of claim 86 wherein said second semiconductor layer formed of low resistivity n-type semiconductor material comprises a first region of relatively pure CdS and a second superimposed region of indium-doped CdS.

90. The transducer of claim 81 wherein said grid-like upper contact formed on the surface of said second semiconductor layer is aluminum.

91. The transducer of claim 90 wherein an anti-reflective coating is formed on said grid-like conact and on the exposed surface of said second semiconductor layer.

92. The transducer of claim 91 wherein said antireflective coating comprises $SiO_x$ wherein "x" is on the order of "1.8".

93. In a method of forming a photovoltaic light-to-electrical energy transducer of the type including a thin-film A-B-type heterojunction where "A" and "B" are selected from the group of semiconductor materials consisting of

| A | and | B |
|---|---|---|
| (i) a p-type ternary material | and | an n-type material; |
| (ii) an n-type ternary material | and | a p-type material; |
| (iii) an n-type material | and | a p-type ternary material; |
| (iv) a p-type material | and | an n-type ternary material; |

and wherein the transducer includes a substrate, a first contact deposited on the substrate, a first semiconductor layer formed of A-type material deposited on the first contact, a second semiconductor layer formed of B-type material deposited on the first semiconductor layer and defining therewith the thin-film A-B-type heterojunction, and a second contact deposited on the second semiconductor layer, the improvement comprising a method wherein:

(a) the one of the first and second semiconductor layers formed of a ternary semiconductor material is formed by simultaneous elemental evaporation of the ternary semiconductor material to form a semiconductor layer having two composition graded regions sequentially formed one upon the other with one region having a first preselected ratio of two of the elements in the ternary semiconductor material so as to form a low resistivity semiconductor region and the other of the regions having a different preselected ratio of the same two elements so as to form a high resistivity transient semiconductor region and with the two regions defining a transient homojunction;

(b) the other of the first and second semiconductor layers is formed by deposition of a semiconductor material in face-to-face contact with respect to the high resistivity transient semiconductor region of the transient homojunction; and, (c) the energy transducer formed is heated subsequent to steps (a) and (b);

to thereby form a transducer wherein the high resistivity transient semiconductor region formed in step (a) is permitted to evolve through elemental interdiffusion into a region of relatively high resistivity semiconductor material of the same type as the low resistivity region formed in step (a) so as to form a thin-film A-B-type heterojunction photovoltaic light-to-electrical energy transducer.

94. The method of forming a photovoltaic light-to-electrical energy transducer including a thin-film A-B-type heterojunction as set forth in claim 93 wherein the transducer formed is heated during step (c) in the presence of air.

95. The method of forming a photovoltaic light-to-electrical energy transducer including a thin-film A-B-type heterojunction as set forth in claim 93 wherein the transducer formed is heated during step (c) in the presence of $H_2$/Ar and air.

96. The method of forming a photovoltaic light-to-electrical energy transducer including a thin-film A-B-type heterojunction as set forth in claims 93, 94, or 95 wherein the transducer formed is heated during step (c) at a temperature on the order of 200° C.

97. The method of forming a photovoltaic light-to-electrical energy transducer including a thin-film A-B-type heterojunction as set forth in claims 93, 94 or 95 wherein the transducer formed is heated during step (c) at a temperature on the order of 200° C. for a period on the order of 20 minutes.

98. The method of forming a photovoltaic light-to-electrical energy transducer including a thin-film A-B-type heterojunction as set forth in claims 93, 94 or 95 wherein the A-B-type heterojunction is a p-n-type heterojunction and the one semiconductor layer defining the transient homojunction defines a transient p-n-type homojunction having a region of low resistivity p-type material and a region of high resistivity transient n-type material, and the other semiconductor layer is formed of n-type semiconductor material deposited in face-to-face contact with the region of high resistivity transient n-type material.

99. The method of forming a photovoltaic light-to-electrical energy transducer including a thin-film A-B-type heterojunction as set forth in claims 93, 94 or 95 wherein the A-B-type heterojunction is an n-p-type heterojunction and the one semiconductor layer defining the transient homojunction defines a transient n-p-type homojunction having a region of high resistivity transient n-type material and a region of low resistivity p-type material, and the other semiconductor layer is formed on n-type semiconductor material deposited in face-to-face contact with the region of high resistivity transient n-type material.

100. The method of forming a photovoltaic light-to-electrical energy transducer including a thin-film A-B-type heterojunction as set forth in claims 93, 94 or 95 wherein the ternary material is selected from the group of I-III-$VI_2$ chalcopyrite compounds.

101. The method of forming a photovoltaic light-to-electrical energy transducer including a thin-film A-B-type heterojunction as set forth in claims 93, 94 or 95 wherein the ternary material is selected from the group of I-III-$VI_2$ chalcopyrite compounds and the other of the first and second semiconductor layers is formed of materials selected from the group of II-VI elements.

102. The method of forming a photovoltaic light-to-electrical energy transducer including a thin-film A-B-type heterojunction as set forth in claims 93, 94 or 95 wherein the ternary semiconductor material is $CuInSe_2$.

103. The method of forming a photovoltaic light-to-electrical energy transducer including a thin-film A-B-type heterojunction as set forth in claims 93, 94 or 95 wherein the other of the first and second semiconductor layers has a band gap energy greater than 1.5 ev.

104. The method of forming a photovoltaic light-to-electrical energy transducer including a thin-film A-B-type heterojunction as set forth in claims 93, 94 or 95 wherein the other of the first and second semiconductor layers is selected from the group consisting of:

CdS;

$Cd_{1-x}Zn_xS$; and, $CdS_{1-x}Se_x$.

105. The method of forming a photovoltaic light-to-electrical energy transducer including a thin-film A-B-type heterojunction as set forth in claims 93, 94 or 95 wherein the ternary semiconductor material is $CuInSe_2$ and the other of the first and second semiconductor layers is selected from the group consisting of:

CdS;

$Cd_{1-x}Zn_xS$; and, $CdS_{1-x}Se_x$.

106. The method of forming a photovoltaic light-to-electrical energy transducer including a thin-film A-B-type heterojunction as set forth in claims 93, 94 or 95 wherein the ternary semiconductor material is $CuInSe_2$ and the other of the first and second semiconductor layers is CdS.

107. The method of forming a photovoltaic light-to-electrical energy transducer including a thin-film A-B-type heterojunction as set forth in claims 93, 94 or 95 wherein the ternary semiconductor material is a I-III-$VI_2$ chalcopyrite compound and the ratio of the I-III-elements is adjusted during one portion only of simultaneous elemental evaporation of the ternary compound so as to form one of the low resistivity and transient high resistivity regions of the transient homojunction, and adjusted to a different I-III ratio during the remaining portion of simultaneous elemental evaporation of the ternary compound so as to form the other of the low resistivity and the transient high resistivity regions of the transient homojunction.

108. The method of forming a photovoltaic light-to-electrical energy transducer including a thin-film A-B-type heterojunction as set forth in claims 93, 94 or 95 wherein the ternary semiconductor layer is $CuInSe_2$ and the copper/indium ratio is initially adjusted to form a slightly copper-enriched region during simultaneous elemental evaporation of the $CuInSe_2$ to form the low resistivity region of the transducer of p-type material, and is readjusted to form a slightly copper-deficient region during simultaneous elemental evaporation of the $CuInSe_2$ to form the high resistivity transient semiconductor region of the transducer of transient n-type material.

109. The product produced by the method set forth in claims 93, 94 or 95.

110. The method of forming a p-n-type heterojunction photovoltaic device comprising the steps of:

(a) depositing a first region of relatively low resistivity p-type material on a metallized substrate;

(b) depositing a second region of relatively high resistivity transient n-type material formed of the same elemental constituents as the relatively low resistivity p-type material deposited in step (a) with such transient n-type material being deposited on the first region of p-type material and defining therewith a transient p-n-type homojunction;

(c) depositing a film of low resistivity n-type semiconductor material on the transient p-n-type homojunction formed in steps (a) and (b); and, (d) heating the p-n-type heterojunction photovoltaic device formed in steps (a), (b) and (c);

whereupon interdiffusion of the constituent elements of the materials employed in steps (a), (b) and (c) between the p-type material and the transient n-type material, and between the transient n-type material and the n-type semiconductor material, causes the transient n-type material to evolve into relatively high resistivity p-type material so as to form a thin-film heterojunction essentially devoid of growth nodules and providing a photovoltaic response characteristic of energy transducers having relatively high conversion efficiencies.

111. The method of claim 110 wherein the device formed is heated during step (d) in the presence of air.

112. The method of claim 110 wherein the device formed is heated during step (d) in the presence of $H_2$/Ar and air.

113. The method of claims 110, 111 or 112 wherein the device formed is heated during step (d) at a temperature on the order of 200°C.

114. The method of claims 110, 111 or 112 wherein the device formed is heated during step (d) at a temperature on the order of 200° C. for a period on the order of 20 minutes.

115. The method of claim 110 wherein the first and second regions of p-type and transient n-type material, respectively, comprise a ternary semiconductor material formed by simultaneous elemental evaporation.

116. The method of claim 115 wherein the ternary semiconductor material is a chalcopyrite compound.

117. The method of claim 115 wherein the ternary semiconductor material is a material selected from the class of I-III-$VI_2$ chalcopyrite compounds.

118. The method of claim 115 wherein the ternary semiconductor material is $CuInSe_2$.

119. The method of claim 118 wherein the copper/indium ratio in the ternary semiconductor material is initially adjusted to form a slightly copper-enriched region during simultaneous elemental evaporation thereof to form the first region of relatively low resistivity p-type material in step (a) and is readjusted during such simultaneous elemental evaporation to form a slightly copper-deficient ternary compound during evaporation of the second region of relatively high resistivity transient n-type material formed in step (b).

120. The method of claim 118 wherein the copper/indium ratio is altered upon formation of at least about 50% of the total desired thickness of the transient p-n-type homojunction but prior to formation of about 66.7% of the total desired thickness of the transient p-n-type homojunction.

121. The method of claim 118 wherein the film of low resistivity n-type semiconductor material is formed of n-type material having a band gap energy greater than 1.5 ev.

122. The method of claim 121 wherein the n-type low resistivity semiconductor material is a II-VI material.

123. The method of claim 127 wherein the II-VI material is selected from the group consisting of:

CdS;

$Cd_{1-x}Zn_xS$; and, $CdS_{1-x}Se_x$.

124. The method of claim 122 wherein the II-VI material is CdS.

125. The method of claim 110 wherein the film of low-resistivity n-type semiconductor material comprises a first region of relatively pure CdS and a second superimposed region of indium-doped CdS.

126. The method of claim 110 wherein the first and second regions of semiconductor material formed in steps (a) and (b) are formed of a temperature in the range of 350° C. to 500° C.

127. The method of claim 110 wherein the first region of semiconductor material formed in step (a) and a portion of the second region of semiconductor material formed in step (b) are formed at a temperature in the range of 350° C. to a temperature less than 450° C., and the remainder of the second region of semiconductor material formed in step (b) is formed at a temperature in the range of about 450° to 500° C.

128. The method of claim 110 wherein the first region of semiconductor material formed in step (a) and a portion of the second region of semiconductor material formed in step (b) are formed at a temperature on the order of 350° C., and the remainder of the second region of semiconductor material formed in step (b) is formed at a temperature on the order of 450° C.±approximately 25° C.

129. The method of claim 110 wherein the film of low resistivity n-type semiconductor material formed in step (c) is formed at a temperature in the range of 150° C. to 200° C.

130. The method of claims 126, 127 or 128 wherein the film of low resistivity n-type semiconductor material formed in step (c) is formed at a temperature in the range of 150° C. to 200° C.

131. The method of claims 110, 116, 117, 118, 124, 132 or 133 wherein the first and second regions of semiconductor material formed in steps (a) and (b) are formed in an atmosphere maintained at $3\text{-}8\times10^{-6}$ torr.

132. The method of claims 110, 116, 117 or 118 wherein a grid-like contact is formed on the film of low resistivity n-type semiconductor material deposited in step (c) and an antireflective coating is formed on the grid-like contact and the exposed surface of the film of low resistivity n-type semiconductor material.

133. The method of claims 110, 115, 116, 117 or 118 wherein a grid-like contact is formed on the film of low resistivity n-type semiconductor material deposited in step (c) and an antireflective coating formed of $SiO_x$ is formed on the grid-like contact and the exposed surface of the film of low resistivity n-type semiconductor material.

134. The method of claims 110, 111, 117 or 118 wherein a grid-like contact is formed on the film of low resistivity n-type semiconductor material deposited in step (c) and an antireflective coating formed of $SiO_x$ wherein "x" is on the order of "1.8" is formed on the grid-like contact and the exposed surface of the film of low resistivity n-type semiconductor material.

135. The product produced by the method set forth in claims 110, 115, 116, 117, 118, 119, 127, 128 or 129.

136. A thin-film A-B type heterojunction photovoltaic device wherein "A" and "B" are selected from the group of semiconductor materials consisting of:

| A | AND | B |
|---|---|---|
| (1) a p-type ternary material | and | an n-type material; or, |
| (2) an n-type ternary material | and | a p-type material; or, |
| (3) an n-type material | and | a p-type ternary material; or, |
| (4) a p-type material | and | an n-type ternary material; |

comprising a first semiconductor layer [having been formed with a first region of A-type material and a second superimposed region of transient B-type material with said first and second regions initially defining a transient A-B-type homojunction, and a second semiconductor layer deposited on said first layer and formed of a second B-type material whereupon interdiffusion of the constituent elements defining: (i) said A-type material; (ii) said transient B-type material; and (iii), said second B-type material; causes the transient B-type material to evolve into A-type material so as to form a thin-film] *formed of A-type material and a second superimposed semiconductor layer formed of B-type material deposited on said first layer; one of said first and second semiconductor layers having been formed with a first region of ternary material comprising a selected one of a p-type ternary material or an n-type ternary material, and a second transient region of ternary material of the opposite conductivity type as that selected in said first region, said second transient region of ternary material being adjacent the other of said first and second semiconductor layers, with said first and second regions of said one of said first and second semiconductor layers initially defining a transient homojunction comprising one of a p-n-type or an n-p-type homojunction; whereupon interdiffusion of the constituent elements defining: (i) said first region of ternary material in said one of said first and second semiconductor layers respectively formed of A-type and B-type materials; (ii) said second transient region of ternary material in said one of said first and second semiconductor layers; and (iii), the other of said first and second semiconductor layers; causes the second transient region of ternary material to evolve into a ternary material having the same p-type of n-type characteristic as said first region of ternary material so as to form a thin-film A-B-type* heterojunction permitting a photovoltaic response characteristic of an energy transducer capable of exhibiting a conversion efficiency approximating on the order of 10%.

137. The thin-film A-B-type heterojunction photovoltaic device set forth in claim 136 wherein said A-B-type heterojunction is a p-n-type heterojunction with said first semiconductor layer defining said transient [A-B-] homojunction having been formed as a transient p-n-type homojunction having a *first* region of low resistivity p-type material and a *second* region of high resistivity transient n-type material, and said second semiconductor layer is formed of n-type semiconductor material deposited in face-to-face contact with said *second transient* region of high resistivity transient n-type material.

138. The thin-film A-B-type heterojunction photovoltaic device as set forth in claim 136 wherein said A-B-type heterojunction is an n-p-type heterojunction with said first semiconductor layer defining said transient [A-B] homojunction having been formed as a transient n-p-type homojunction having a [region of high resistivity transient n-type material and a region of low resistivity] *first region of low resistivity n-type material and a second region of high resistivity transient* p-type material, and said second semiconductor layer is formed of [n-type] *p-type* semiconductor material deposited in face-to-face contact with said *second transient* region of high resistivity transient [n-type] *p-type* material.

139. The thin-film A-B-type heterojunction photovoltaic [devive] *device* as set forth in claim 136 wherein [said first semiconductor layer is formed of a] *one of said first and second semiconductor layers is formed of first and second regions of* ternary material selected from the group of I-III-$VI_2$ chalcopyrite compounds.

140. The A-B-type heterojunction photovoltaic device as set forth in claim 136 wherein [said first semiconductor layer is formed of a] *one of said first and second semiconductor layers is formed of first and second regions of* ternary material selected from the group of I-III-$VI_2$ chalcopyrite compounds and [said second semiconductor layer] *the other of said first and second semiconductor layers* is formed of materials selected from the group of II-VI elements.

141. The thin-film A-B-type heterojunction photovoltaic device as set forth in claims 139 or 140 wherein said ternary material has a band gap energy in the range of 1–1.5 ev.

142. The thin-film A-B-type heterojunction photovoltaic device as set forth in claims 139 or 140 wherein said ternary material has a band gap energy in the range of 1–1.5 ev and [said second semiconductor layer is] *the other of said first and second semiconductor layers is* formed of materials having a band gap energy greater than 1.5 ev.

143. The thin-film A-B-type heterojunction photovoltaic device as set forth in claims 136, 137 or 138 wherein said g [first semiconductor layer is formed of $CuInSe_2$.] *ternary material is $CuInSe_2$.*

144. The thin-film A-B-type heterojunction photovoltaic device as set forth in claims [141, 142 or 143] *136, 137 or 138* wherein [said second semiconductor layer] *the other of said first and second semiconductor layers* has a band gap energy greater than 1.5 ev.

145. The thin-film A-B-type heterojunction photovoltaic device as set forth in claims 136, 137 or 138 wherein [said second semiconductor layer] *the other of said first and second semiconductor layers* is formed of materials selected from the group consisting of:

CdS;

$Cd_{1-x}Zn_xS$; and, $CdS_{1-x}Se_x$.

146. The thin-film A-B-type heterojunction photovoltaic device as set forth in claims 136, 137 or 138 wherein [said first semiconductor is formed of a ternary semiconductor material comprising $CuInSe_2$ and said second semiconductor layer] *one of said first and second semiconductor layers is formed of a ternary semiconductor material comprising $CuInSe_2$* and the other of said first and second semiconductor layers is formed of materials selected from the group consisting of:

CdS;

$Cd_{1-x}Zn_xS$; and, $CdS_{1-x}Se_x$.

147. The thin-film A-B-type heterojunction photovoltaic device as set forth in claims 136, 137 or 138 wherein [said first semiconductor layer is formed of a ternary semiconductor material comprising $CuInSe_2$ and said second semiconductor layer is CdS.] *one of said first and second semiconductor layers is formed of a ternary semiconductor material comprising $CuInSe_2$ and the other of said first and second semiconductor layers is CdS.*

* * * * *